US011048475B2

(12) United States Patent
Hagspiel et al.

(10) Patent No.: US 11,048,475 B2
(45) Date of Patent: Jun. 29, 2021

(54) MULTI-CYCLE KEY COMPARES FOR KEYS AND RECORDS OF VARIABLE LENGTH

(71) Applicant: INTERNATIONAL BUSINESS MACHINES CORPORATION, Armonk, NY (US)

(72) Inventors: Norbert Hagspiel, Wendlingen (DE); Jörg-Stephan Vogt, Holzgerlingen (DE); Christian Jacobi, West Park, NY (US); Thomas Fuchs, Bietigheim-Bissingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 387 days.

(21) Appl. No.: 15/827,644

(22) Filed: Nov. 30, 2017

(65) Prior Publication Data

US 2019/0163441 A1    May 30, 2019

(51) Int. Cl.
*G06F 16/00* (2019.01)
*G06F 7/16* (2006.01)
(Continued)

(52) U.S. Cl.
CPC .................. *G06F 7/16* (2013.01); *G06F 7/24* (2013.01); *G06F 7/36* (2013.01); *G06F 12/04* (2013.01); *G11C 7/1006* (2013.01)

(58) Field of Classification Search
CPC ... G06F 7/16; G06F 7/36; G06F 12/04; G06F 7/24; G06F 16/2246; G06F 16/24578; G06F 16/322; G06F 16/9027; G11C 7/1006
See application file for complete search history.

(56) References Cited

U.S. PATENT DOCUMENTS 4,131,947 A * 12/1978 Armstrong ................ G06F 7/24
707/752
4,210,961 A    7/1980 Whitlow
(Continued)

FOREIGN PATENT DOCUMENTS

CN          106326421 A     1/2017
WO      WO2014090097 A1    6/2014

OTHER PUBLICATIONS

Petrut, Patricia et al., "Configurable FPGA Architecture for Hardware-Software Merge Sorting," 2016 MIXDES—23$^{rd}$ International Conference for Mixed Design of Integrated Circuits and Systems, Jun. 2016, pp. 1-3.

(Continued)

*Primary Examiner* — Noosha Arjomandi
(74) *Attorney, Agent, or Firm* — William A. Kinnaman, Jr., Esq.; Blanche E. Schiller, Esq.; Heslin Rothenberg Farley & Mesiti P.C.

(57) ABSTRACT

Multi-cycle key compare units. A compare unit includes a comparator, additional compare logic and at least one pair of buffers which provide input to the comparator. The compare unit sorts variable length records in streaming mode without the need for complex state machines to maintain state relating to the comparing. A record may have a variable length key and optional variable length data. The record and/or the key is split into fixed, pre-defined lengths. The total key and record lengths are unknown to the comparator of the compare unit.

20 Claims, 17 Drawing Sheets

(51) Int. Cl.
*G06F 7/24* (2006.01)
*G06F 12/04* (2006.01)
*G06F 7/36* (2006.01)
*G11C 7/10* (2006.01)

(56) References Cited

U.S. PATENT DOCUMENTS

| | | | |
|---|---|---|---|
| 5,121,493 A | 6/1992 | Ferguson | |
| 5,185,888 A | 2/1993 | Tanaka | |
| 5,204,967 A | 4/1993 | Armstrong | |
| 5,210,870 A | 5/1993 | Baum | |
| 5,274,805 A | 12/1993 | Ferguson | |
| 5,487,164 A | 1/1996 | Kirchhofer | |
| 5,535,384 A | 7/1996 | Kasahara | |
| 5,619,693 A | 4/1997 | Troisi | |
| 5,765,159 A * | 6/1998 | Srinivasan | G06F 16/289 |
| 5,777,755 A | 7/1998 | Aoki | |
| 5,903,780 A | 5/1999 | Fushimi | |
| 6,005,603 A * | 12/1999 | Flavin | H04N 21/435 |
| | | | 375/E7.024 |
| 6,181,678 B1 | 1/2001 | Ha-Duong | |
| 6,330,559 B1 | 12/2001 | Azuma | |
| 6,453,405 B1 | 9/2002 | Hoyle | |
| 6,519,593 B1 | 2/2003 | Matias | |
| 7,496,572 B2 * | 2/2009 | Blaicher | G06F 16/2282 |
| 8,352,470 B2 | 1/2013 | Chen et al. | |
| 8,352,540 B2 * | 1/2013 | Anglin | G06F 3/067 |
| | | | 709/201 |
| 8,447,901 B2 | 5/2013 | Stanfill et al. | |
| 8,725,734 B2 | 5/2014 | Boh et al. | |
| 8,880,551 B2 * | 11/2014 | Hinshaw | G06F 16/2455 |
| | | | 707/770 |
| 9,026,485 B2 | 5/2015 | Pawlowski | |
| 9,129,004 B2 | 9/2015 | Yaroslavskiy et al. | |
| 9,268,863 B2 | 2/2016 | Buyuktosunoglu et al. | |
| 9,501,359 B2 | 11/2016 | Pundir et al. | |
| 9,612,799 B2 | 4/2017 | Hayashizaki et al. | |
| 9,619,499 B2 | 4/2017 | Asaad et al. | |
| 9,632,787 B2 | 4/2017 | Bodine | |
| 9,971,633 B1 * | 5/2018 | Barsness | G06F 8/433 |
| 2002/0032683 A1 | 3/2002 | Namba | |
| 2005/0010590 A1 | 1/2005 | Blaicher | G06F 16/2282 |
| 2006/0294312 A1 * | 12/2006 | Walmsley | H04L 9/0662 |
| | | | 711/122 |
| 2007/0162425 A1 * | 7/2007 | Betawadkar-Norwood | |
| | | | G06F 16/24535 |
| 2007/0294319 A1 * | 12/2007 | Mankad | G06F 11/1662 |
| 2008/0114805 A1 * | 5/2008 | Nord | H04L 65/605 |
| 2009/0063485 A1 | 3/2009 | Schneider | |
| 2009/0182714 A1 | 7/2009 | Sezer | |
| 2010/0042624 A1 | 2/2010 | Min et al. | |
| 2010/0092065 A1 | 4/2010 | Jones et al. | |
| 2011/0055232 A1 * | 3/2011 | Graefe | G06F 12/08 |
| | | | 707/752 |
| 2011/0167148 A1 * | 7/2011 | Bodziony | H04L 41/5035 |
| | | | 709/224 |
| 2011/0258205 A1 | 10/2011 | Shinjo | |
| 2012/0106309 A1 | 5/2012 | Oishi | |
| 2013/0173872 A1 * | 7/2013 | Terek | G06F 12/00 |
| | | | 711/154 |
| 2014/0279985 A1 | 9/2014 | Fontenot et al. | |
| 2014/0351366 A1 | 11/2014 | Maeda | |
| 2014/0365527 A1 | 12/2014 | Fuchs et al. | |
| 2015/0127649 A1 | 5/2015 | Felch | |
| 2015/0178338 A1 | 6/2015 | Hayashizaki et al. | |
| 2015/0331619 A1 | 11/2015 | Zheng | |
| 2015/0347592 A1 * | 12/2015 | Buyuktosunoglu | G06F 16/22 |
| | | | 711/122 |
| 2016/0117215 A1 * | 4/2016 | Gadelrab | G06F 11/0742 |
| | | | 714/56 |
| 2016/0188644 A1 | 6/2016 | Sukhwani et al. | |
| 2016/0316045 A1 * | 10/2016 | Treves | H04L 69/22 |
| 2017/0083515 A1 * | 3/2017 | Brodt | G06F 16/273 |
| 2017/0083570 A1 | 3/2017 | Asaad et al. | |
| 2017/0235814 A1 | 8/2017 | Branscome | |
| 2018/0349406 A1 * | 12/2018 | Shortlidge | G06F 16/178 |
| 2019/0004768 A1 | 1/2019 | Li | |
| 2019/0163442 A1 | 5/2019 | Hagspiel et al. | |
| 2019/0163443 A1 | 5/2019 | Hagspiel et al. | |
| 2019/0163444 A1 * | 5/2019 | Vogt | G06F 9/544 |

OTHER PUBLICATIONS

Sears, Russell et al., "bLSM: A General Purpose Log Structured Merge Tree," SIGMOD '12, May 2012, pp. 217-228.
Srivastava Ajitesh, et al., "A Hybrid Design for High Performance Large-scale Sorting on FPGA," 2015 International Conference on Reconfigurable Computing and FPGAs, Dec. 2015, pp. 1-6.
Koch, Dirk et al., "FPGASort: A High Performance Sorting Architecture Exploiting Run-time Reconfiguration on FPGAs for Large Problem Sorting," FPGA '11, Feb. 2011, pp. 45-54.
Casper, Jared et al., "Hardware Acceleration of Database Operations," FPGA '14, Feb. 2014, pp. 151-160.
Hagspiel, Norbert et al., "Buffer Size Optimization in a Hierarchical Structure," U.S. Appl. No. 15/827,697, filed Nov. 30, 2017, pp. 1-50.
Hagspiel, Norbert et al., "Hierarchical Sort/Merge Structure Using a Request Pipe," U.S. Appl. No. 15/827,784, filed Nov. 30, 2017, pp. 1-49.
Vogt, Jorg-Stephan et al., "Sorting Using Pipelined Compare Units," U.S. Appl. No. 15/827,831, filed Nov. 30, 2017, pp. 1-49.
List of IBM Patents or Patent Applications Treated as Related, May 30, 2018, 2 pages.

* cited by examiner

MULTI-CYCLE KEY COMPARES FOR KEYS AND RECORDS OF VARIABLE LENGTH

BACKGROUND

One or more aspects relate, in general, to facilitating processing within systems that sort records, and in particular, to facilitating sorting of records having variable lengths and/or variable length keys.

Unsorted lists of records may be sorted using a variety of techniques. One such technique used for sorting large amounts of data is a sort/merge technique, in which small subsets of the data are sorted into pre-sorted lists, and then the pre-sorted lists are merged into a sorted list.

The sort/merge technique may be implemented in software and/or hardware. Each record to be sorted has a key and optionally data. In hardware, the merging is performed by comparing the keys of the records in streaming mode. These keys are a fixed length up to a maximum key length which can be processed and compared in a single cycle. To change the key size between jobs, the hardware is reconfigured.

SUMMARY

Shortcomings of the prior art are overcome and additional advantages are provided through the provision of a compare unit. The compare unit includes a comparator, and the comparator includes one input to receive one beat of one record to be sorted. The one beat includes one set of control indicators, and wherein one or more control indicators of the one set of control indicators specify a type of the one beat. The comparator further includes another input to receive another beat of another record to be sorted. The other beat includes another set of control indicators, and wherein one or more control indicators of the other set of control indicators specify a type of the other beat. The comparator further includes logic coupled to the one input and the other input to compare the one beat and the other beat to provide a result. At least the one or more control indicators of the one set of control indicators and the one or more control indicators of the other set of control indicators are to be used to determine the result.

Methods, systems, circuits and/or program products relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

In accordance with an aspect of the present invention, multi-cycle key compare units are provided in hardware. A compare unit includes, for instance, a comparator, additional compare logic and at least one pair of buffers which provide input to the comparator. The compare unit sorts variable length records in streaming mode without the need for complex state machines to maintain state relating to the comparing. A record may have a variable length key and optional variable length data. The record and/or key is split into fixed, pre-defined lengths, which are unknown to the comparator of the compare unit. The total key length can change between sort/merge runs without reconfiguring the compare unit.

In one embodiment, a record is split into multiple beats, and each beat may include at least a portion of a key, at least a portion of data or both, in which a portion includes one or more bits. A beat also includes, in accordance with one or more aspects of the present invention, one or more control indicators that provide control information used in comparing beats of one record with beats of another record.

In one aspect, the compare unit is used in a hierarchical sort/merge structure in which there are one or more compare units on each level of the hierarchy of the hierarchical sort/merge structure. In a further aspect, the hierarchical sort/merge structure is transformed into a folded sort/merge structure in which each level of the folded sort/merge structure has, in one example, only one compare unit. The compare unit of a particular level includes all (or a selected subset) of the buffer pairs for that level. Each buffer pair of the buffer pairs is sized to include at least one record.

In yet a further aspect, many of the buffers of the buffer pairs of the folded sort/merge structure are reduced in size to include at least a maximum key size, but less than a full record. The reduced size buffers can keep multiple records, if space permits. Therefore, they are used as circular or ring buffers and a pair of arrays is provided on each level to track the local ring buffer offsets within each buffer to use during a particular cycle. The pair of arrays include, for instance, a read address array and a write address array.

In still another aspect, the write address array is replaced with a request pipe that further facilitates the hardware logic and processing. The request pipe has a plurality of entries, and each entry tracks the write address of both buffers for a buffer pair being compared. The address in the request pipe is the address for the data being compared, and as the winner compare data will have to be replaced, it is the write address for the refill data coming from one level above.

Figure 1:
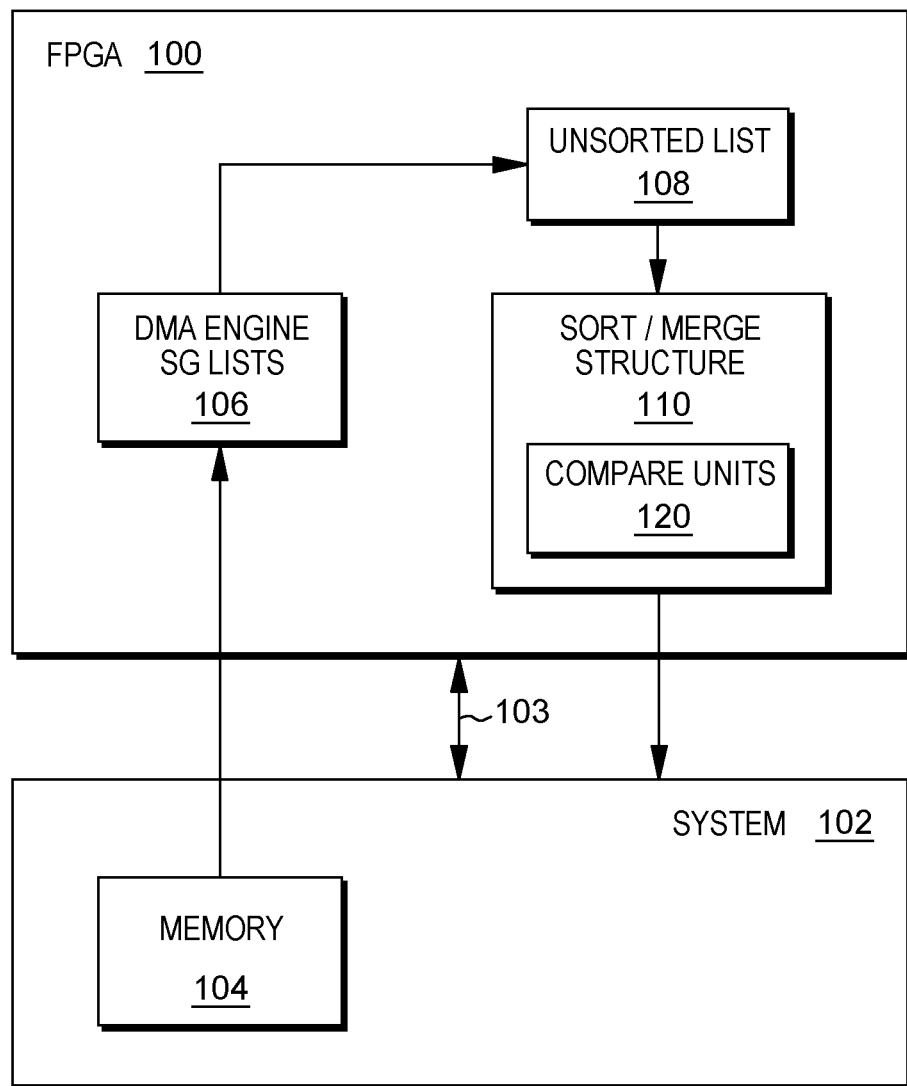
FIG. 1 depicts one example of a field programmable gate array (FPGA) to implement one or more aspects of the present invention.

As an example, the compare units are implemented in a field-programmable gate array (FPGA). Referring to FIG. 1, in one embodiment, a field programmable gate array 100 may be coupled to a system 102 via an input/output interface 103, such as a peripheral component interconnect express (PCIe) bus. System 102 includes memory 104 accessible, in one example, by a direct memory access (DMA) engine 106 of FPGA 100. The DMA engine obtains (e.g., retrieves, is provided, etc.) data from memory 104 that is to be sorted. In one example, the data is collected from different locations in memory. The different locations are placed in scatter-gather (SG) lists. For a sort operation, one scatter/gather list includes a plurality of address ranges to collect one stream of input records to sort. For a merge operation, several scatter/gather lists, each with a plurality of address ranges, collect several streams of presorted input records to merge. An unsorted list of data 108 is selected from DMA engine 106, and the selected unsorted list is input to a sort/merge structure 110. Sort/merge structure 110 is, for instance, a hierarchical structure (e.g., a tree structure) that includes a plurality of compare units 120. The unsorted list is sorted via sort/merge structure 110, and the output may be provided back to system 102 and stored in memory 104. Further details relating to one example of system 102 are described with reference to FIG. 2.

Figure 2:
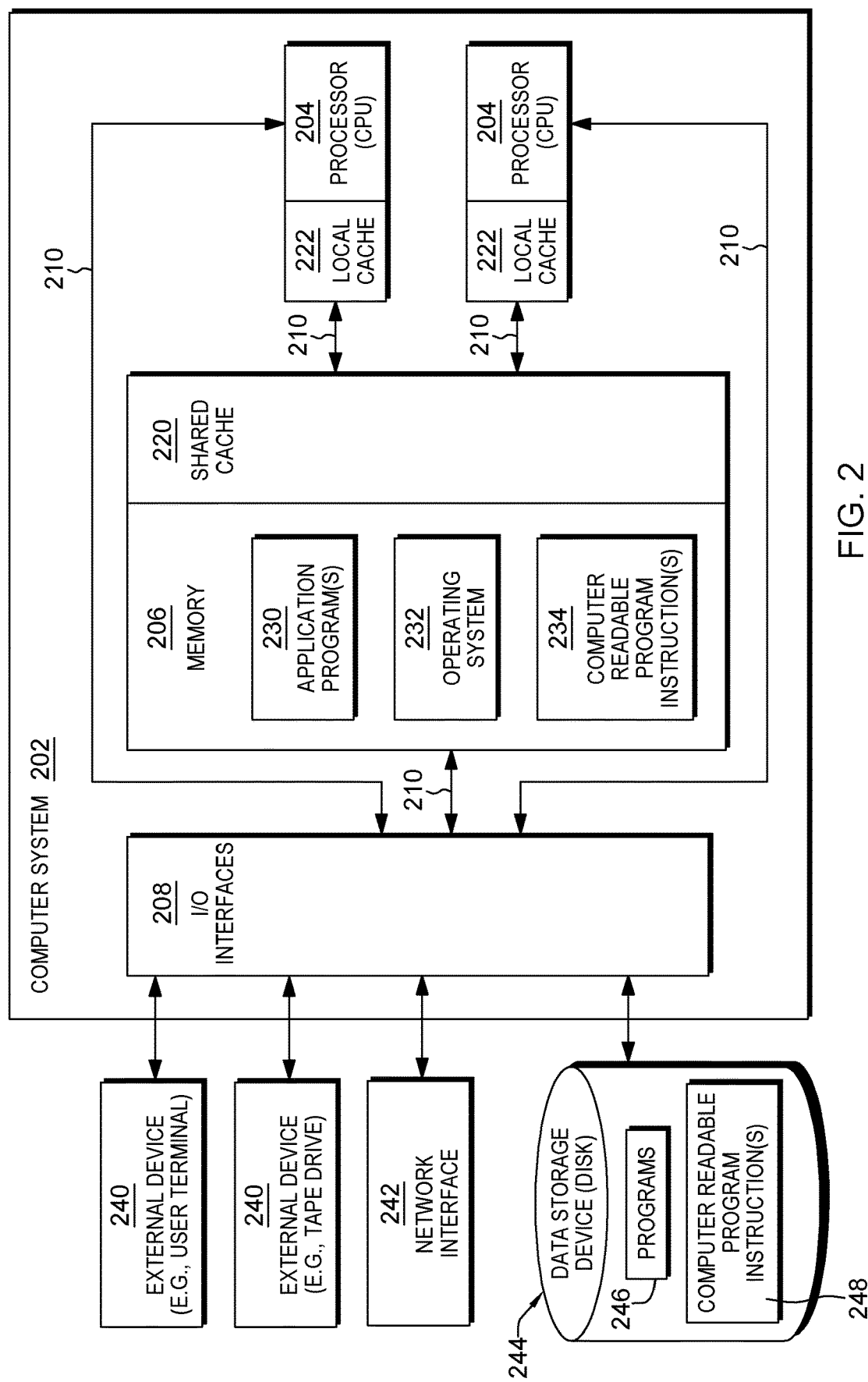
FIG. 2 depicts one example of a system coupled to the field programmable gate array of FIG. 1, in accordance with one or more aspects of the present invention.

In one example, system 102 is a computer system. An example computer system is shown in FIG. 2, e.g., in the form of a general-purpose computing device. A computer system 202 may include, but is not limited to, one or more processors or processing units 204 (e.g., central processing units (CPUs)), a memory 206 (a.k.a., system memory, main memory, main storage, central storage or storage, as examples), and one or more input/output (I/O) interfaces 208, coupled to one another via one or more buses and/or other connections 210.

Bus 210 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, the Peripheral Component Interconnect (PCI), and the Coherent Accelerator Processor Interface (CAPI).

Memory 206 may include, for instance, a cache 220, such as a shared cache, which may be coupled to local caches 222 of processors 204. Further, memory 206 may include one or more programs or applications 230, an operating system 232, and one or more computer readable program instructions 234.

Computer system 202 may also communicate via, e.g., I/O interfaces 208 with one or more external devices 240, one or more network interfaces 242, and/or one or more data storage devices 244. Example external devices include a user terminal, a tape drive, a pointing device, a display, an accelerator, etc. Network interface 242 enables computer system 202 to communicate with one or more networks, such as a local area network (LAN), a general wide area network (WAN), and/or a public network (e.g., the Internet), providing communication with other computing devices or systems.

Data storage device 244 may store one or more programs 246, one or more computer readable program instructions 248, and/or data, etc.

Computer system 202 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 202. Examples, include, but are not limited to: microcode, device drivers, redundant processing units, external disk drive arrays, RAID systems, tape drives, and data archival storage systems, etc.

Computer system 202 may be operational with numerous other general purpose or special purpose computing system environments or configurations. Examples of well-known computing systems, environments, and/or configurations that may be suitable for use with computer system 202 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Figure 3:
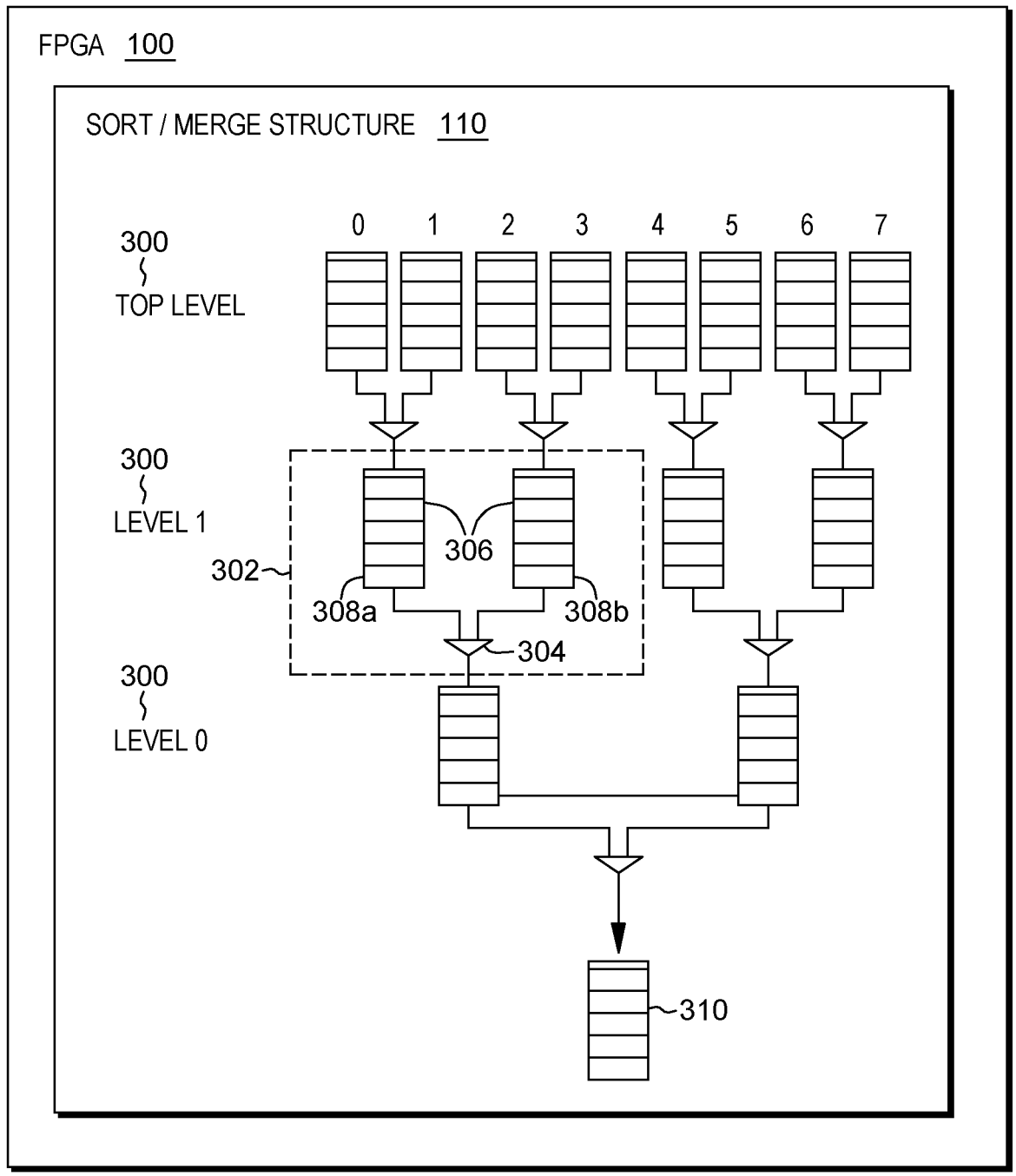
FIG. 3 depicts one example of a hierarchical sort/merge structure of one or more aspects of the present invention.

Further details regarding sort/merge structure 110 are described with reference to FIG. 3. In one example, sort/merge structure 110 has a plurality of levels 300, and each level includes one or more compare units 302. Each compare unit 302 includes, for instance, a comparator 304 and a buffer pair 306, as well as additional compare logic not shown. Buffer pair 306 includes a pair of buffers referred to herein as a left buffer 308a and a right buffer 308b. Buffers 308a, 308b are input to their respective comparator 304.

Although in this example, the sort/merge structure includes seven compare units used to provide an output 310, in other examples, there may be more or fewer than seven compare units. Typically, there would be many more compare units to sort unsorted lists in such a structure. For instance, a 1024 list input to the sort/merge structure uses 1023 compare units. Many examples are possible. The number of compare units in the hierarchical sort/merge structure depends on the number of input lists desired to be sorted.

Figure 4:
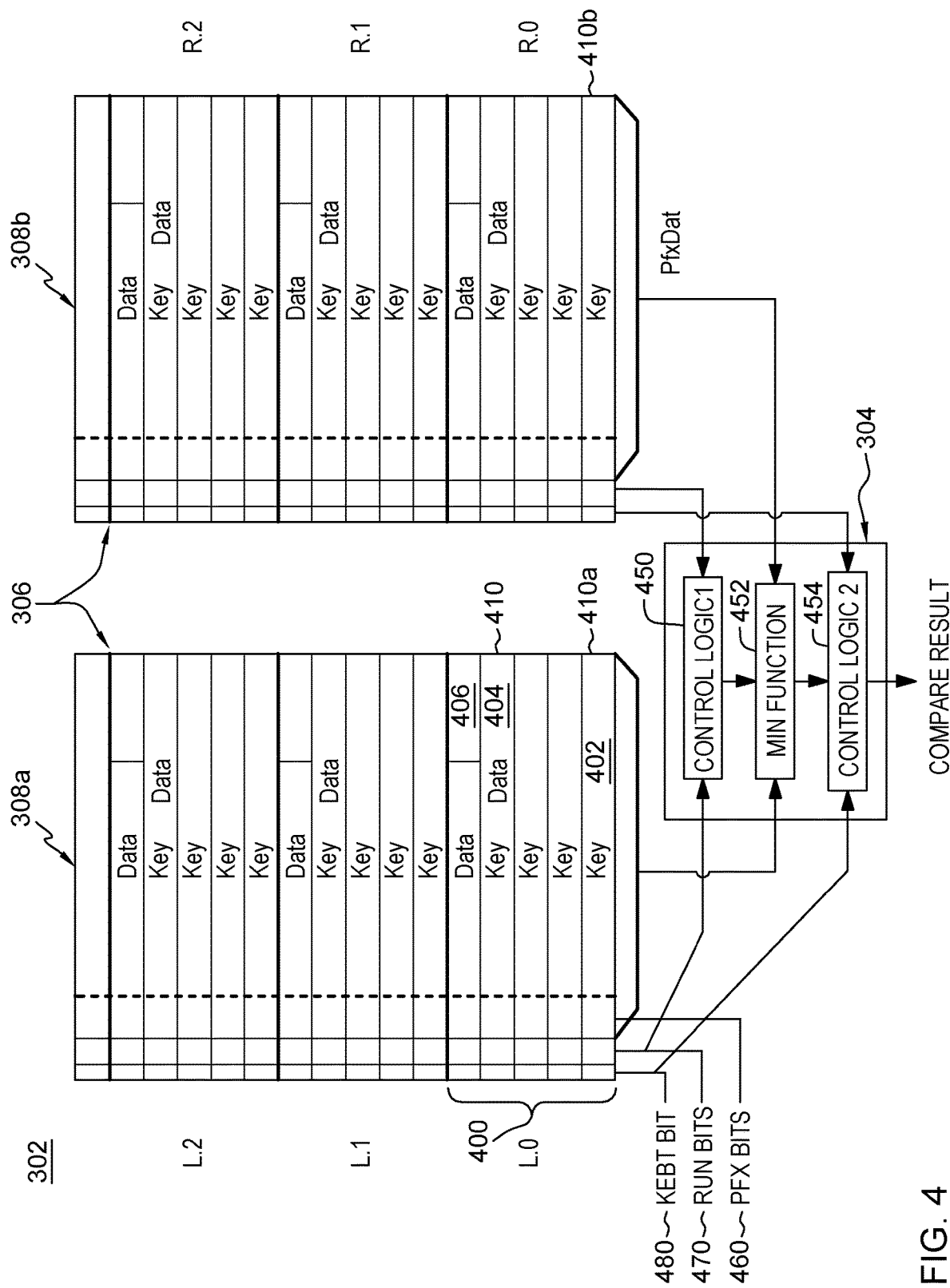
FIG. 4 depicts one example of buffers having record beats to be compared in accordance with one or more aspects of the present invention.

Further details regarding a compare unit are described with reference to FIG. 4. As shown, in one example, compare unit 302 includes buffer pair 306 coupled to comparator 304. Buffer pair 306 includes left buffer 308a and right buffer 308b. Each buffer may include one or more records 400. In one example, each record 400 includes a key 402 and optionally, data 404. In the example in FIG. 4, left buffer 308a includes three records: L.0, L.1, L.2, and right buffer 308b also includes three records, R.0, R.1, R.2.

Since the internal bus of the FPGA is of a defined size (e.g., 16B), any record over the defined size is divided into multiple beats 410. For instance, each record in this example is divided into five beats. A beat 410 may include at least a portion of key 402, at least a portion of data 404, at least a blank portion 406 (also referred to as an empty portion), and/or any combination of key, data and empty portions.

A beat 410a from left buffer 308a and a beat 410b from right buffer 308b are input to comparator 304, which compares the beats using a defined function and provides an output. This output may be referred to herein as the winner beat. In one example, comparator 304 includes first control logic 450, a defined function 452, and second control logic 454 to perform a Calcwin function that produces the winner beat. First control logic 450 and second control logic 454 are described further below. In one example, defined function 452 is a minimum function, but this is only one example. Many different functions may be used, including a maximum function, as well as various other functions. The comparator compares the beats, e.g., bit by bit, without knowledge of the type of beat (e.g., key beat, data beat, etc.) or any controls associated with the beat, as described further below.

Figure 5A:
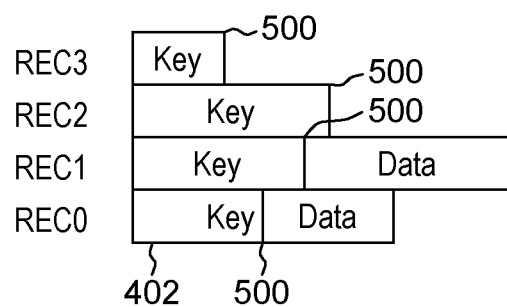
FIG. 5A depicts one example of variable length keys used in accordance with an aspect of the present invention.
Figure 5B:
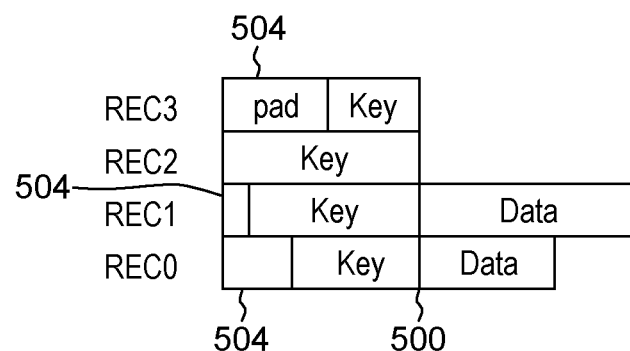
FIG. 5B depicts one example of padding key portions, in accordance with an aspect of the present invention.

As indicated, a record may include a key, and the key may be of variable size. As shown in FIG. 5A, a key 402 may be of a variable size, as illustrated by an end of key indicator 500 in each of the records that depicts different size keys. However, in accordance with an aspect of the present invention, and with reference to FIG. 5B, a fixed key size per record is provided by padding 504 the key with a pre-specified character or symbol, including but not limited to, a blank represented by zeros, etc. Padding can be left-aligned or right-aligned, depending on the characteristics of the data to be sorted. As shown in FIG. 5B, the end of key indicator 500 is at the same location for each record. The size of each key and/or key portion however is not provided to the comparator; instead, the comparator just compares the bits of the beats provided to it.

Returning to FIG. 4, as indicated, in one embodiment, a beat 410a from left buffer 308a and a beat 410b from right buffer 308b are input to comparator 304, which compares the beats using a selected function and produces a compare result. Comparator 304 receives a continuous stream of bits to be compared; i.e., it compares on each clock cycle even if there is no valid key or data to be compared. The comparator compares the input bits provided to it without regard for the meaning of the bits. It does not know if the bits represent a key, data or an empty portion.

Further, in accordance with an aspect of the present invention, each beat also includes one or more control indicators, which are input to comparator 304 and compared. These control indicators are set by the top level logic that provides data to the top level buffers based on its analysis of the incoming data records (e.g., record length, key length, run—each stream of records corresponds to a particular run). Again, these control indicators are compared without knowledge of the meaning of the indicators. The comparator simply compares the bits representing the indicators and determines a compare result, based on the specified function of the comparator.

In one example, the control indicators include a prefix indicator (PFX) 460, a run indicator (RUN) 470, and a key end beat indicator (KEBT) 480, each of which is described herein.

In one example, prefix indicator 460 is input to defined function 452 and includes two bits that have the following meaning, in one embodiment:
  00: Data Data beat—in a compare, data wins against a key
  01: EOB End of buffer—stall—waiting for data from system memory
  10: Key Key beat—no special compare condition, compare as is
  11: EOL End of list—no more valid beats to be compared for the input list of records (a.k.a., stream). This means that the particular top level input of the hierarchical sort/merge structure has become empty and can be ignored for this run. It does not stall any compares for this run. Once the lowest level output shows a record with EOL or a new run, all input lists for that run have become empty, and the merge (for that run) is complete. In contrast, EOB means the input list has more data, but that data is not yet known (as it is still on the way from system memory). As the data is not yet known, any compare with it is to be stalled.

Run indicator 470 (also known as wrap bits or color value) is input to first control logic 450 and used to indicate which run the records are with. Records of the same run are to be compared to one another. If the comparator receives a record of a different run, such that the comparator is comparing bits of one run with bits of another run, the bits of the current run being compared will win in the compare. As an example, run indicator 470 includes two bits, in which there is a wrap-around: 00<01<10<11<00. Other examples are possible.

Key end beat indicator (KEBT) 480 is input to second control logic 454 and includes, for instance, one bit that indicates the end of the key beat. At that point, the compare will have a defined winner, even if the two keys being compared are equal. When comparing a new key, there is no previous winner.

The use of the control indicators enables the comparator to compare on each cycle without knowing what is being compared and without needing complex state machines to track what is being compared or to track the previous winner beat. The comparator compares bit by bit, beat (or entry) by beat (or entry) without complex state machines and allows the data to be routed with its associated key—i.e., no separation of keys and data for comparison; therefore, no tracking of key and data is used, in one example, to determine association.

Figure 6:
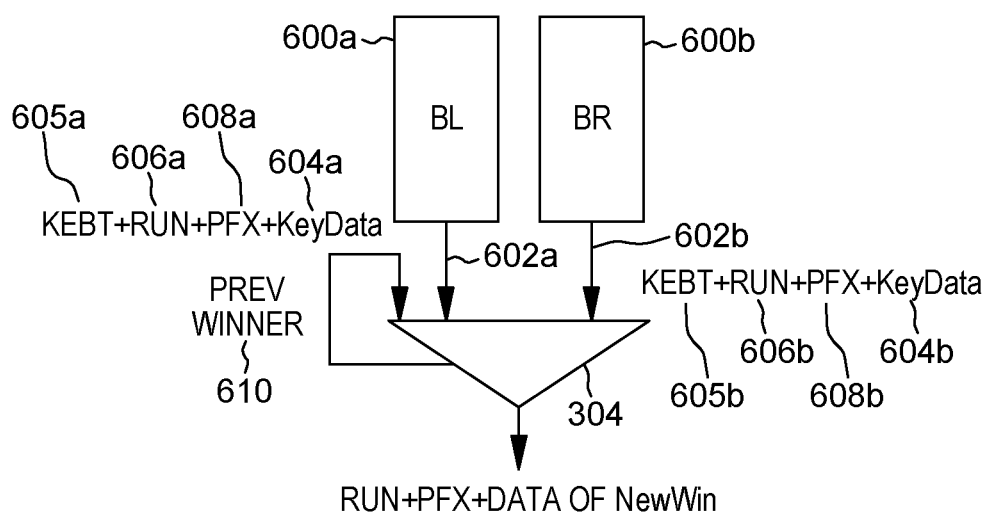
FIG. 6 depicts one example a buffer pair coupled to a comparator, in accordance with an aspect of the present invention.

Further details regarding using the control indicators are described with reference to FIGS. 6 and 7. As shown in FIG. 6, comparator 304 (e.g., having a minimum function) receives from a left buffer 600a a first input 602a and from a right buffer 600b a second input 602b. Input 602a includes key/data 604a (e.g., key and/or data bits) of a beat of a record, as well as key end beat indicator 605a, a run indicator 606a and prefix indicator 608a of the beat; and input 602b includes key/data 604b of another beat of another record, as well as key end beat indicator 605b, a run indicator 606b and prefix indicator 608b. Also input to comparator 304 is another input referred to a previous winner (PrevWin) 610, which is further described below with reference to FIG. 7.

Figure 7:
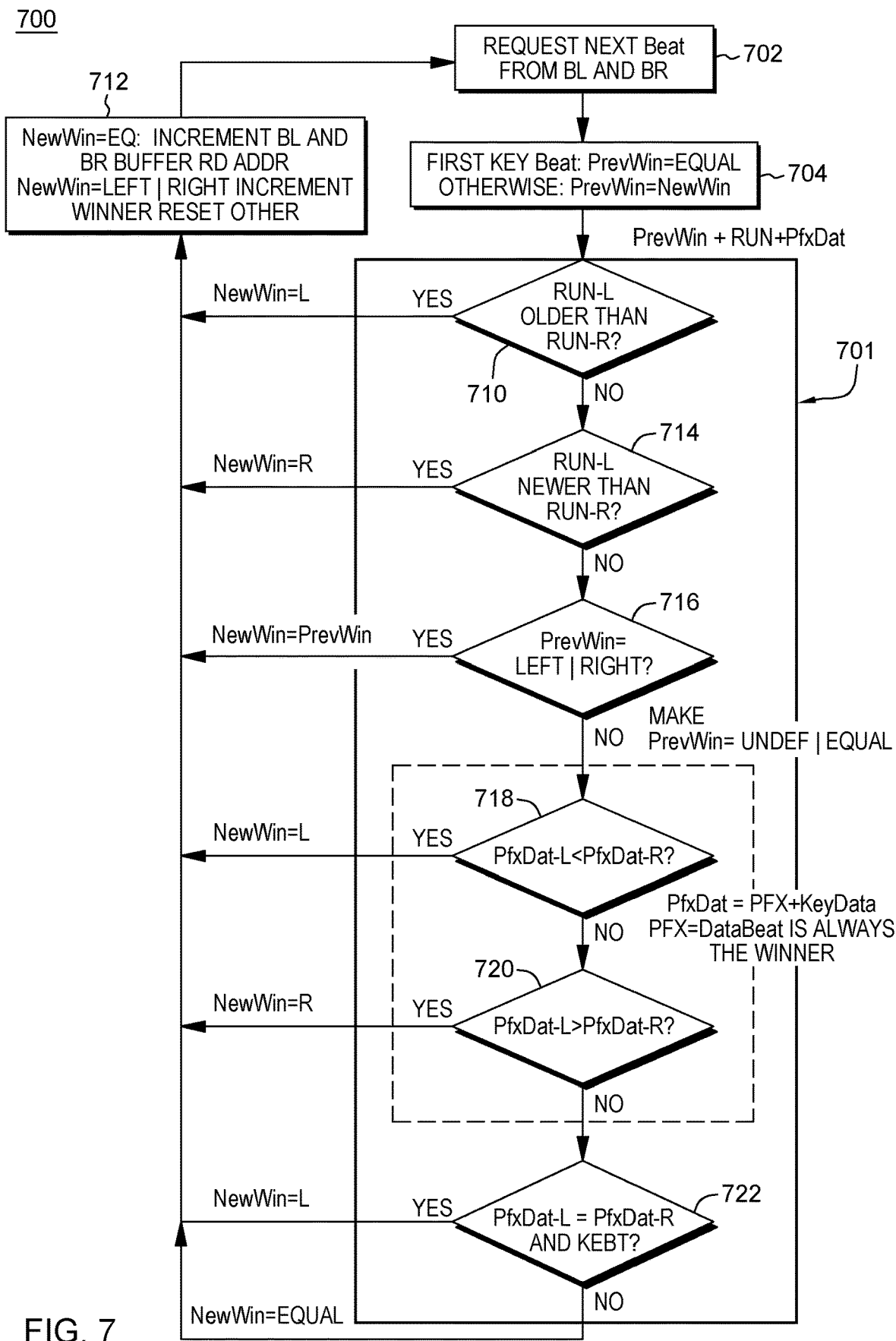
FIG. 7 depicts one example of processing associated with a compare unit to implement one or more aspects of the present invention.

FIG. 7 depicts one example of logic 700 of a compare unit, referred to herein for convenience as compare logic. Compare logic 700 includes logic 701 of a comparator, such as comparator 304, as well as additional logic. As one example, logic 701 includes first control logic 450 (e.g., 710, 714, 716), defined function 452 (e.g., 718, 720), and second control logic 454 (e.g., 722). The compare logic is implemented, for instance, in an FPGA. In the example below, it is assumed that the compare unit is on a hierarchical level n, and a higher level is referred to as level n+1 and a lower level is referred to as level n−1.

Referring to FIG. 7, compare logic 700 includes request logic 702 to request a beat from both a left buffer (BL) and a right buffer (BR) coupled to the comparator. In this example, if this is the first key beat (a key beat includes at least a portion of a key), a signal PrevWin is set to EQUAL, as a starting point; otherwise, it is set to NewWin (704). PrevWin, the run indicator, and PfxDat, where PfxDat refers to PFX+key and/or data of a beat (PrevWin+RUN+PfxDat) are input to logic 701 of the comparator, which compares the input bits, as described below. In one example, the compare performs a minimum function, but in other embodiments, other functions may be performed.

In one embodiment, initially, the bits of the run indicator (referred to herein as run bits) from the left buffer (RUN-L) and the run bits from the right buffer (RUN-R) are compared. A determination is made as to whether RUN-L is older than RUN-R (710). If RUN-L is older than RUN-R (i.e., RUN-L is the current run being compared), then a signal NewWin is set equal to L (for left buffer) indicating that the left buffer is the winner of the compare (referred to herein for convenience as winner). Processing continues to 712, at which the pointer to the left buffer is incremented, since the left buffer is the winner, and therefore, a next beat is to be requested for the left buffer from a buffer pair at a next higher level. The pointer of the other buffer (the right buffer in this example) is reset to the first beat, in one example. Processing then continues to 702, in which the next beat is requested for the left buffer and the first beat remains in the right buffer.

Returning to 710, if RUN-L is not older than RUN-R, then a further determination is made as to whether RUN-L is newer than RUN-R (714). If RUN-L is newer than RUN-R, then NewWin is set equal to R (for right buffer), and processing continues to 712. At 712, since NewWin is set equal to R, the pointer to the right buffer is incremented, such that the next beat is received for the right buffer, and the pointer of the other buffer (the left buffer in this example) is reset to the first beat of the record. Processing then continues to 702, in which the next beat is requested for the right buffer and the first beat remains in the left buffer.

Returning to 714, if RUN-L is not older than or newer than RUN-R, then a further determination is made as to whether PrevWin is set equal to left or right (716). If PrevWin is set equal to left or right, then the value of NewWin is set equal to PrevWin, and processing continues 712.

Returning to 716, if PrevWin is not equal to left or right, then set PrevWin to undefined or equal, and the prefix indicator and the key/data of the beats (PfxDat) are compared. In one example, a determination is made as to whether PfxDat-L (i.e., the prefix bits plus the key and/or data bits of the beat of the left buffer) is less than (<) PfxDat-R (i.e., the prefix bits plus the key and/or data bits of the beat of the right buffer) 718. If PFX for one of the buffers indicates a data beat (e.g., PFX=00), then the data beat wins. If PfxDat-L is less than PfxDat-R, then NewWin is set equal to L, and processing continues with 712; otherwise, processing continues with 720, in which a determination is made as to whether PfxDat-L is greater than (>) PfxDat-R. If PfxDat-L is greater than PfxDat-R, then NewWin is set equal to R, and processing continues to 712.

Returning to 720, if PfxDat-L is not less than or greater than PfxDat-R (i.e., they are equal), then a further determination is made as to whether they are equal and whether one of the beats being compared indicates the end of the key for its record (indicated by KEBT indicator 480) 722. If so, then NewWin is set to left, in this example (in another example, it may be set to right); otherwise NewWin is set to equal, and in both cases, processing continues to 712. If NewWin is set to equal, then the pointer for both the left and right buffers are incremented.

As described above, in accordance with an aspect of the present invention, one or more control indicators are added to the beats being compared to provide efficiencies in the comparison such that state machines are not needed. For instance the prefix indicator, which includes an indication of a key beat, a data beat, end of buffer or end of list, allows a hardware binary comparator to immediately select the appropriate buffer absent state machines. As a particular example, data wins in a compare between a key and data. As a further example, the end of buffer indicates a stall to allow more beats to be loaded in the buffer. The use of the control indicators allows the compare to be performed in continuous streaming mode in hardware without the use of state machines to track which buffers to be used and/or which buffer is the winner, and without separating the data from the key.

In one embodiment, keys of a large key size are divided into multiple key beats to be processed in consecutive clock cycles, in which the key comparison is performed beat by beat. By using one or more of the control indicators, the key size need not be known by the comparator and no reconfiguration of the FPGA is necessary when the key size changes. Additionally, the data does not need to be separated from the key, but instead, the key and data are streamed together. The comparator is able to perform a binary compare that immediately selects a winner buffer.

In the embodiment described above, there are one or more compare units on each level of the sort/merge structure. In particular, for each level, other than the lowest level (referred to as Level 0 herein), there are a plurality of compare units, as depicted in FIG. 3. Therefore, as shown in FIG. 3, if there are eight lists to be sorted, then there are seven comparators. As a further example, if there are 1024 lists to be sorted at the top level, then there are 1023 compare units. There are many possible examples. However, in a further aspect, an optimization is provided that reduces the number of compare units needed for sustained throughput, in which for a hierarchical sort/merge structure having n levels there are provided n compare units. Thus, for the example in which there are 1024 lists to be sorted, there are nine levels, and therefore, nine compare units, instead of 1023 compare units. This may occur, since, in one embodiment, only one compare unit is active per level at a time. This is described further with reference to FIG. 8.

Figure 8:
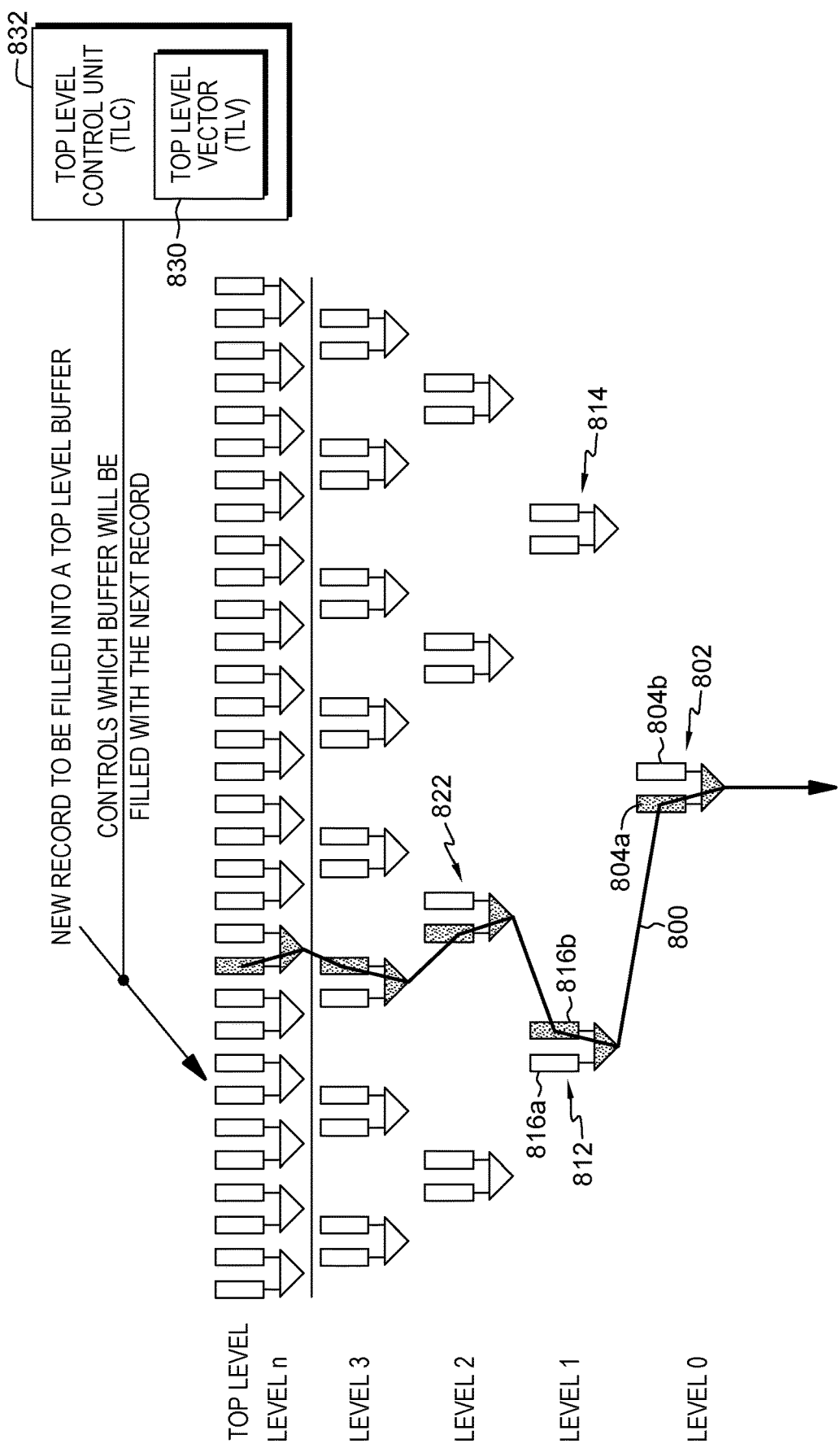
FIG. 8 depicts one example of a flow through winner buffers, in accordance with an aspect of the present invention.

Referring to FIG. 8, the compare unit of one level requests input (e.g., a beat) from a compare unit on a next preceding level to fill the buffer that was the winner on the one level.

This is illustrated by a line 800 drawn through the compare units filling requests for beats. For instance, starting at Level 0, since left buffer 804a of a compare unit 802 is the winner between a compare of left buffer 804a and right buffer 804b, the compare logic of Level 0 requests a beat from compare unit 812 on Level 1, instead of compare unit 814 on Level 1. The particular buffer of compare unit 812 to provide the beat depends on the winner between buffers 816a and 816b.

Further, assuming right buffer 816b is the winner of the compare between the beats in buffers 816a and 816b, compare unit 812 of Level 1 requests a beat from compare unit 822 of Level 2, and so forth.

In one example, the buffers at the top level are filled with records from an input list. A top level control unit (TLC) 832 determines based on information in a top level vector (TLV) 830, which top level buffer gets filled with the next available input record.

Since only one compare unit is active at each level at a time, the compare units of each level are reduced to one compare unit per level. (In another embodiment, a selected number of compare units may be used, which for each level except Level 0, is less than the number typically provided at that level). Again, assuming a sort/merge structure of 1024 inputs at the top level, the sort/merge structure includes nine (9) levels, and therefore, in accordance with an aspect of the present invention, nine compare units are provided instead of 1023 compare units. However, since the number of compare units is reduced, each comparator of the compare unit has one or more buffer pairs associated therewith, referred to herein as a buffer pair array. For instance, each comparator may receive input from all buffer pairs (or a selected number) on its corresponding level. One example of this configuration is depicted in FIG. 9.

Figure 9:
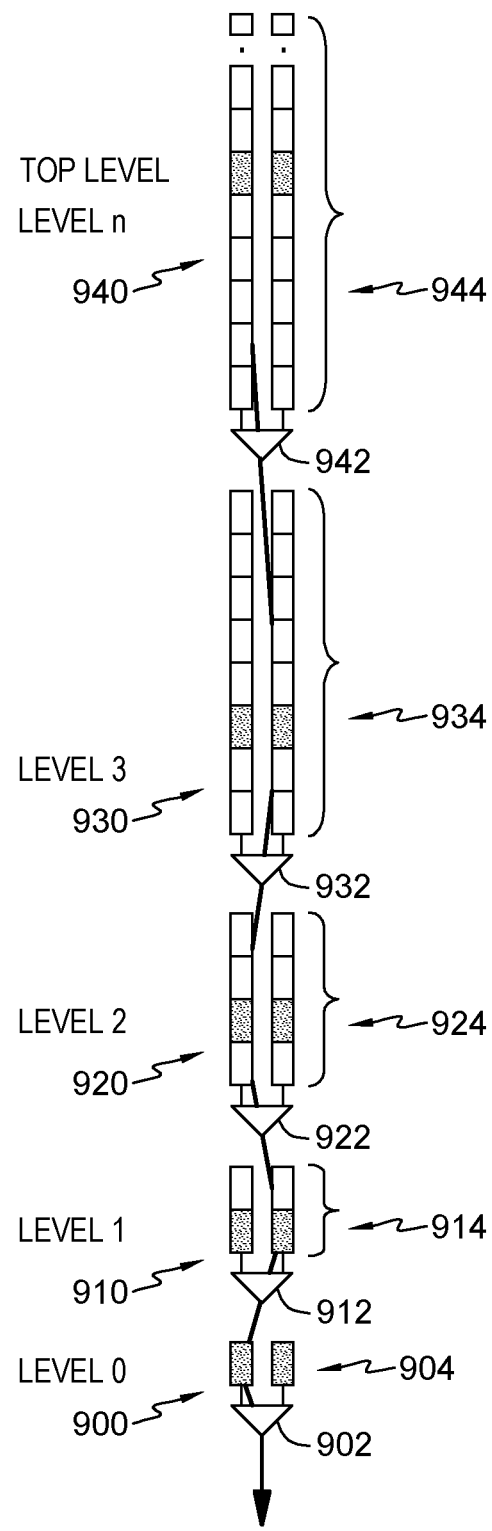
FIG. 9 depicts one example of a hierarchical sort/merge structure (such as shown in FIG. 3) that is transformed into a folded structure, in accordance with an aspect of the present invention.

Referring to FIG. 9, in accordance with an aspect of the present invention, Level 0 includes a compare unit 900 having a comparator 902 and a buffer pair array 904 having one buffer pair (referred to as buffer pair number (BP #) 0); Level 1 includes a compare unit 910 having a comparator 912 and a buffer pair array 914 having two buffer pairs (e.g., BP #0, BP #1, where BP #0 is the first or lowest buffer pair in the array, and BP #1 is the next buffer pair in the array); Level 2 includes a compare unit 920 having a comparator 922 and a buffer pair array 924 having four buffer pairs (e.g., BP # s 0-3); Level 3 includes a compare unit 930 having a comparator 932 and a buffer pair 934 having eight buffer pairs (e.g., BP # s 0-7); and a top level that includes a compare unit 940 having a comparator 942 and a buffer pair array 944 having sixteen buffer pairs (e.g., BP # s 0-15), in this particular example. The shaded buffer pairs correspond to the buffer pairs of FIG. 8 in which the line passes through. For instance, in Level 3, the third buffer pair is shaded, since in FIG. 8, the third compare unit in that level has line 800 drawn through it.

Figure 10A:
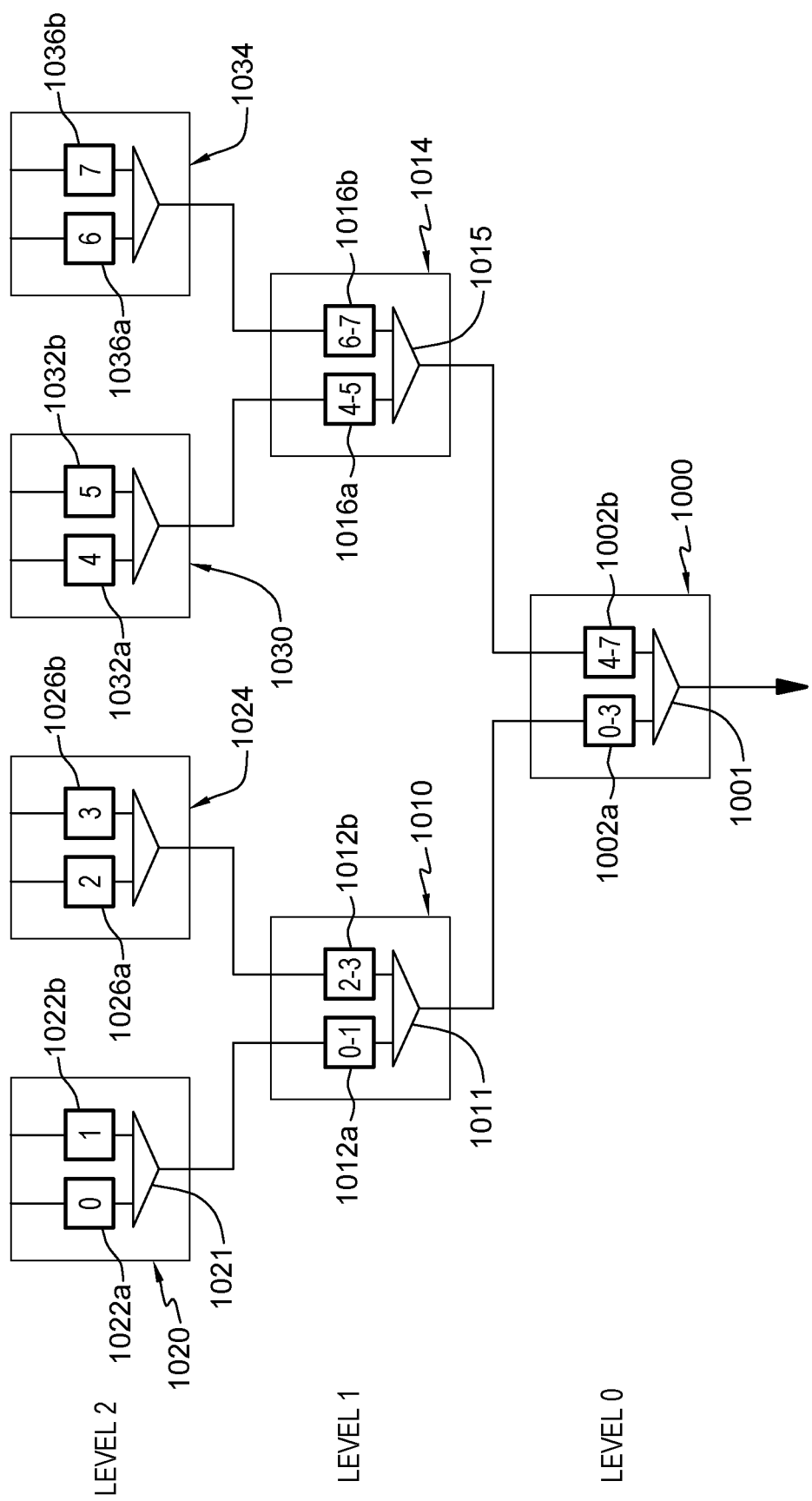
FIG. 10A depicts one example of multiple levels of a hierarchical sort/merge structure including buffer pairs, in accordance with one or more aspects of the present invention.
Figure 10B:
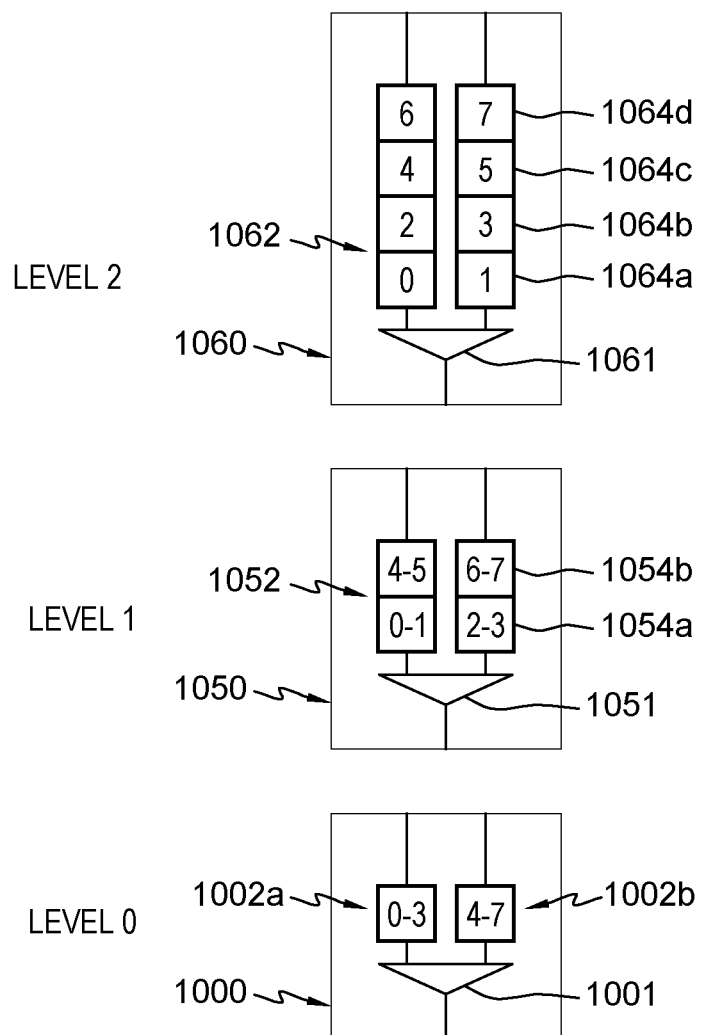
FIG. 10B depicts one example of multiple levels of a folded sort/merge structure including buffer pairs, in accordance with one or more aspects of the present invention.

Another illustration of this aspect of the present invention is depicted in FIGS. 10A-10B, in which FIG. 10A depicts one example corresponding to a conventional structure having three levels, and FIG. 10B depicts a structure, in accordance with an aspect of the present invention, having a corresponding number of levels. Three levels are shown here as just one example and for clarity. Again, each structure may have any number of levels.

In FIG. 10A, Level 0 has one compare unit 1000 including a comparator 1001 and a buffer pair having a left buffer 1002a and a right buffer 1002b. The numbers shown in the buffers are stream numbers. For instance, buffer 1002a receives a stream (e.g., a series of beats) from the winner of compares between stream numbers 0-3, and right buffer 1002b receives a stream from the winner of compares between stream numbers 4-7. Similarly, Level 1 has a compare unit 1010 including a comparator 1011, a left buffer 1012a that receives a stream from the winner between stream numbers 0-1, and a right buffer 1012b that receives a stream from the winner between stream numbers 2-3; and another compare unit 1014 having a comparator 1015, a left buffer 1016a that receives a stream from the winner between stream numbers 4-5, and a right buffer 1016b that receives a stream from the winner between stream numbers 6-7. Additionally, Level 2 has a compare unit 1020 including a comparator 1021, a left buffer 1022a receiving stream number 0, and a right buffer 1022b receiving stream number 1; a comparator 1024 with a left buffer 1026a having stream number 2, and a right buffer 1026b having stream number 3; a comparator 1030 with a left buffer 1032a having stream number 4, and a right buffer 1032b having stream number 5; and a comparator 1034 with a left buffer 1036a having stream number 6, and a right buffer 1036b having stream number 7.

That is, from the top-down, in one example, the winner of the compare between stream 0 and stream 1 is transferred to left buffer 1012a, and the winner of the compare between stream 2 and stream 3 is transferred to right buffer 1012b. Then, the compare between left buffer 1012a and right buffer 1012b is transferred to left buffer 1002a. Similar processing is performed for the other compare units.

The above structure is streamlined as shown in FIG. 10B, in which, in one example, Level 0 includes compare unit 1000 having comparator 1001, left buffer 1002a that receives the winner between stream numbers 0-3, and right buffer 1002b that receives the winner between stream numbers 4-7. Level 1 has one compare unit 1050 that includes a comparator 1051 and a buffer array 1052 that includes a first buffer pair 1054a having a left buffer that receives the winner of streams 0-1 and a right buffer that receives the winner of streams 2-3; and another buffer pair 1054b having a left buffer that receives the winner of streams 4-5 and a right buffer that receives the winner of streams 6-7. Likewise, Level 2 has one compare unit 1060 that includes a comparator 1061 and a buffer array 1062 that includes buffer pairs 1064a-1064d. Each buffer pair 1064a-1064d has a left buffer that receives stream numbers 0, 2, 4 and 6, respectively, and a right buffer that receives stream numbers 1, 3, 5 and 7, respectively. Again, other implementations are possible, and the structure may have more or less levels (typically many more level(s)).

Thus, in this embodiment, one comparator has one or more buffer pairs associated therewith and logic is provided to determine which buffer pair, and in particular, which buffer of the buffer pair, is to provide a beat for a winner buffer on a lower level.

Figure 11:
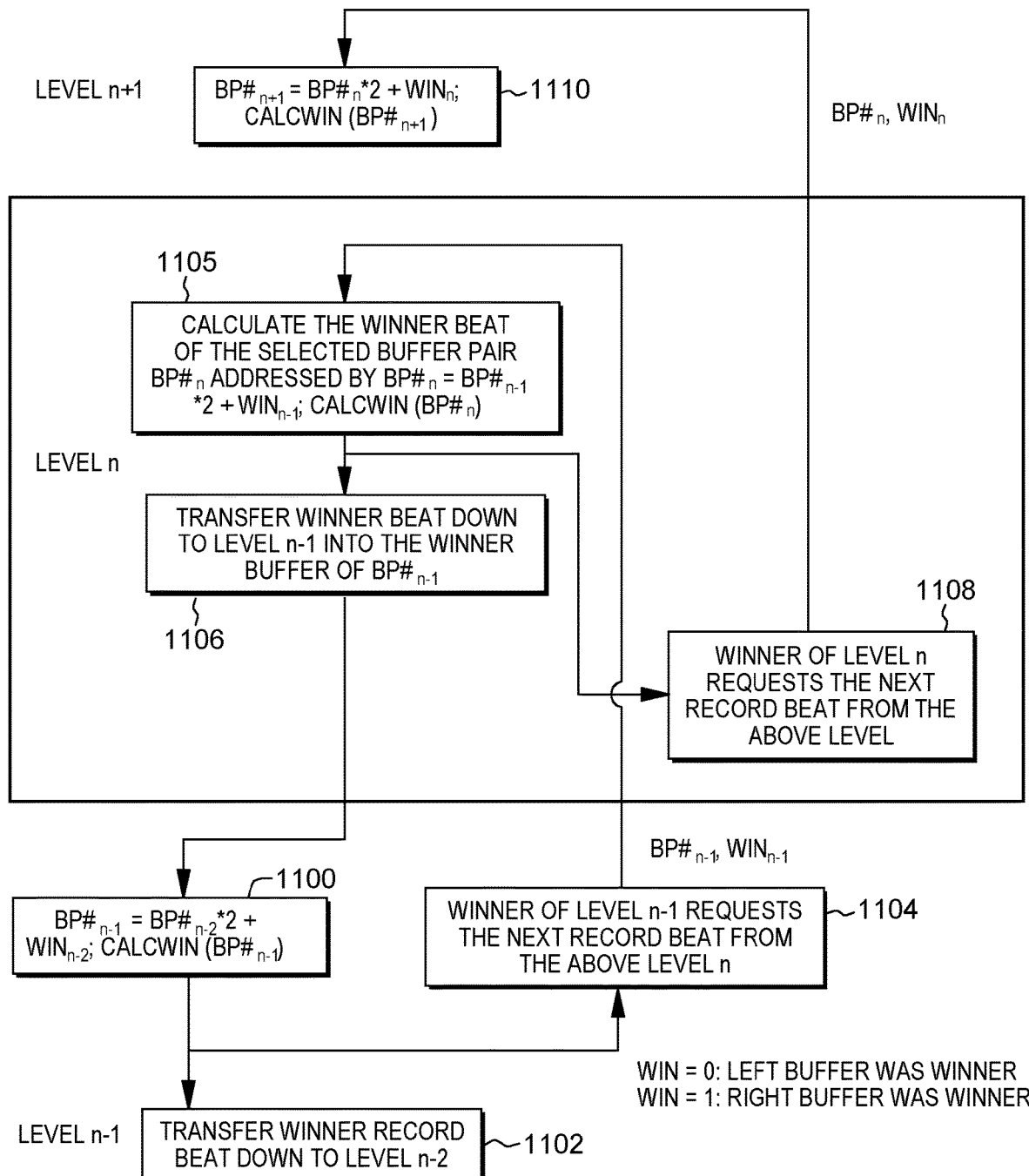
FIG. 11 depicts one example of processing associated with a folded sort/merge structure, in accordance with an aspect of the present invention.

One example of logic used to select the correct buffer pair and the correct buffer of that buffer pair in an implementation that uses one comparator and one or more buffer pairs per level is described with reference to FIG. 11. In FIG. 11, in one example, Level n−1 transfers its winner beat down to Level n−2 and requests from Level n a fill of the winner buffer from which the winner beat is transferred; and Level n is the level to fill the winner buffer of Level n−1 and to request a fill of its winner buffer from Level n+1.

In one example, starting at Level n−1, the winner beat of the compare unit on that level is determined 1100. This includes, for instance, determining the buffer pair number (BP #) of the buffer pair on Level n−1 that includes the winner beat. As an example, BP # and WIN of Level n−2 are used to determine the selected buffer pair number (BP #) of Level n−1. The buffer pair to be selected on Level n−1 is addressed by BP $\#_{n-2}*2+\text{WIN}_{n-2}$. For instance, if BP $\#_{n-2}$ is buffer pair number 0 of Level n−2, and WIN is set to 0 indicating the left buffer of buffer pair 0 was the winner of Level n−2, then BP $\#_{n-1}=0*2+0=0$. Thus, buffer pair 0 of Level n−1 is the selected buffer pair. Then, the winner beat is determined using the Calcwin function of the comparator. For instance, the comparator logic compares two beats from the buffers of BP $\#_{n-1}$ (e.g., buffer pair 0) and determines the winner buffer, and thus winner beat, on Level n−1. The winner beat at Level n−1 is passed down to Level n−2 (1102). Further, the compare unit at Level n−1 requests from Level n a beat to fill its winner buffer that transferred the winner beat down to Level n−2 (1104). The request includes, for instance, the buffer pair number (BP #) of the buffer pair on Level n−1 that includes the winner buffer and an indication (WIN) of the particular buffer of the buffer pair that is the winner. As an example, if WIN=0, then the left buffer of the buffer pair is the winner buffer, and if WIN=1, then the right buffer of the buffer pair is the winner buffer.

At Level n, the winner beat of a selected buffer pair is determined 1105. As an example, BP # and WIN of Level n−1 are used to determine the selected buffer pair number (BP #) of Level n. The buffer pair to be selected on Level n is addressed by BP $\#_{n-1}*2+\text{WIN}_{n-1}$. Then, the winner beat is determined using the Calcwin function of the comparator. For instance, the comparator logic compares two beats from the buffers of BP $\#_n$ and determines the winner buffer, and thus winner beat, on Level n. The determined winner beat is transferred down to Level n−1 to fill the winner buffer of that level 1106. Further, the compare unit of Level n requests the next beat of a selected buffer pair from the next higher level 1108.

At Level n+1, the appropriate buffer pair is selected and the winner of the beats of the selected buffer pair is calculated: BP $\#_{n+1}=\text{BP}_n*2+\text{WIN}_{n-1}$; Calcwin(BP $\#_{n+1}$)1110.

As described above, having a single compare unit with a buffer array, instead of multiple compare units on a particular level, allows efficiencies to be provided including, but not limited to, a reduction and improvement in signal wiring, logic complexity, logic timing and/or use of multiplexors.

In a further aspect, each buffer of the top level buffer pair array is filled with first run records (e.g., RUN0) at the beginning until the buffers are used at least once with RUN0. In this case, the buffers of the left and right buffer pair array that are part of the top level compare unit are filled in the same way. For merging, it is guaranteed that the next input record is higher or equal. In that case, a buffer can be re-filled using the same RUN0 value. Otherwise, the RUN value is increased to RUN1 and subsequent records have RUN1.

Figure 12:
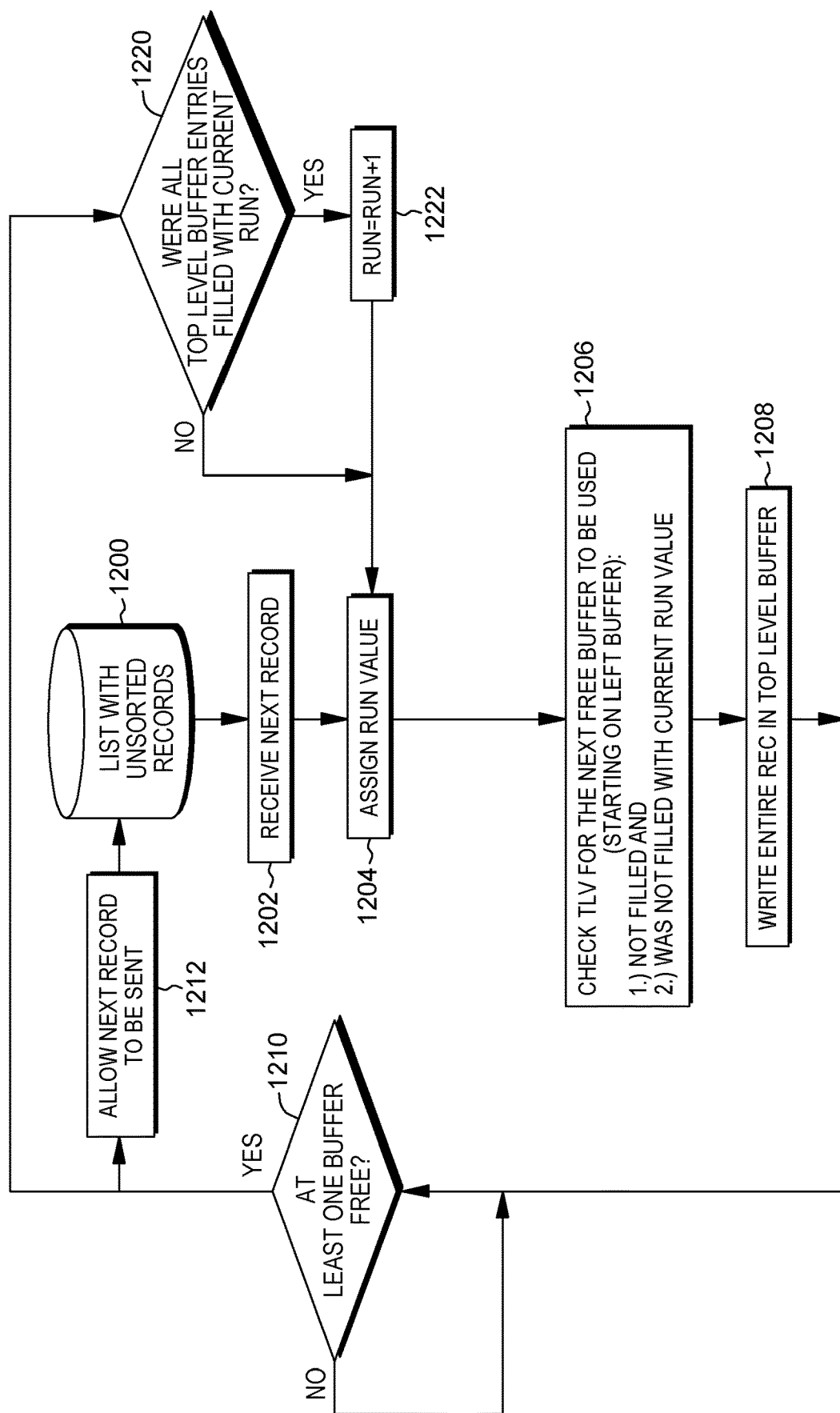
FIG. 12 depicts one example of using a top level buffer control, in accordance with an aspect of the present invention.

One example of continuous streaming with a number of buffers in a top level buffer pair array is described with reference to FIG. 12. In one example, top level control unit 832 (FIG. 8) is used to perform this processing. For sorting, a list of unsorted records is available 1200 (FIG. 12), and a next record (rec) is received 1202. A RUN value is assigned to the record 1204. The top level vector (TLV) is checked for the next free buffer to be used (starting, e.g., with the first left buffer of the buffer pair array) 1206. That is, the top level checks for a buffer that is not filled and was not filled with the current RUN value. The record is written in the next free top level buffer 1208. A determination is made as to whether at least one buffer is free 1210. If not, processing stalls until at least one buffer is free. If a buffer is free, the next record may be sent 1212.

Further, a determination is made by the top level control unit based on the top level vector as to whether all the entries of the top level buffer have been filled with the current RUN, INQUIRY 1220. If so, RUN is incremented, e.g., by 1, STEP 1222. Thereafter, or if not all the entries are filled with the current RUN, then processing continues to 1204.

In yet a further aspect, an optimization is provided which reduces the size of the buffers on one or more levels of the sort/merge structure. In one embodiment, the buffers at the top level are of at least a record size (e.g., 64 KB), but the buffers on each level, except for the top level, are of a size less than a full record size, such as the size of a maximum key size (e.g., 100 bytes). In another embodiment, other selected sizes may be used (e.g., twice the maximum key size, or other sizes) that are less than a full record size. Each of these buffers may be implemented as a ring buffer (also referred to as a circular buffer), and may include one or more key beats, one or more data beats, one or more empty beats, and/or any combination thereof. Further, depending on the size of the buffer, the buffer may include one or more data beats of one record and a key of another record, or multiple full records and a partial record at the beginning and/or end of the buffer. Many examples exist. In one example, the key is to be in one buffer, and not across buffers, but the data may be distributed across a plurality of buffers on a number of levels. The data may even be in the buffer at the top level. The data may be distributed across the buffers, since based on a key winner being determined, the data flows through the levels using the prefix indicators, in accordance with an aspect of the present invention.

Figure 13:
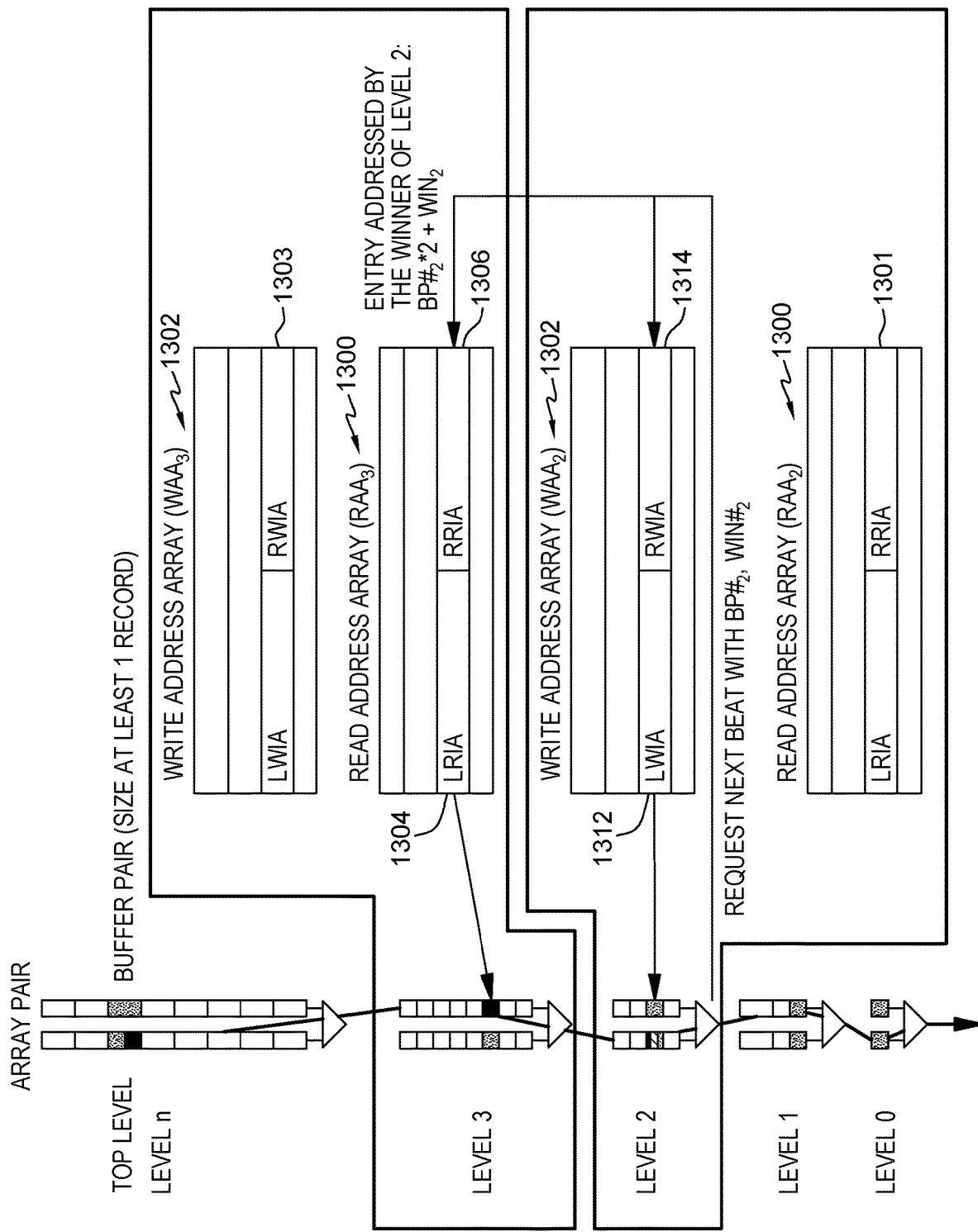
FIG. 13 depicts one example of using a read address array and a write address array, in accordance with an aspect of the present invention.

To implement a sort/merge structure that includes compare units with different size buffers, a set of arrays is provided for each level of the sort/merge structure, as described with reference to FIG. 13. These arrays keep track of the current read and write offsets of the ring buffers within the current buffer pair. In one example, the set of arrays includes a read address array (RAA) 1300 and a write address array (WAA) 1302. These arrays are used to select ring buffer offsets during data transfers. For instance, when a winner is determined on one level, e.g., Level n−1, the winner beat is output, leaving a vacancy to be filled from the next higher level, e.g., Level n. The selection of the beat to fill the vacancy uses the set of arrays.

In one example, read address array 1300 includes one entry 1301 for each buffer pair in the buffer pair array of the compare unit for that particular level. Each entry 1301 includes a left read incremental address (LRIA) 1304, which is the address offset in the left buffer; and a right read incremental address (RRIA) 1306, which is the address offset in the right buffer of the buffer pair associated with that entry. Similarly, write address array 1302 includes one entry 1303 for each buffer pair in the buffer pair array of the compare unit for that particular level. Each entry 1303 includes a left write incremental address (LWIA) 1312, which is the address offset within the left buffer; and a right write incremental address (RWIA) 1314, which is the address offset within the right buffer for the buffer pair associated with that entry. The read addresses are used for fetching data from the specified buffer at the current next higher level (e.g., Level 3, in the example shown in FIG. 13), and the write addresses are used for writing data to the buffer to be filled (e.g., in compare unit 302 on Level 2 of the example depicted in FIG. 13).

Compare unit 302 requests a next beat to be written to the winner buffer of compare unit 302 that has a vacancy. Compare unit 302 provides an indication of the winner buffer to the read address array, and that indication is used to select a read incremental address (either LRIA or RRIA) from the array. The selected incremental address is used to access the beat to be transferred from Level 3 to Level 2, in this example. The winner beat being transferred is written to the buffer address offset indicated by the appropriate write incremental address (e.g., the address offset within the winner buffer).

Figure 14:
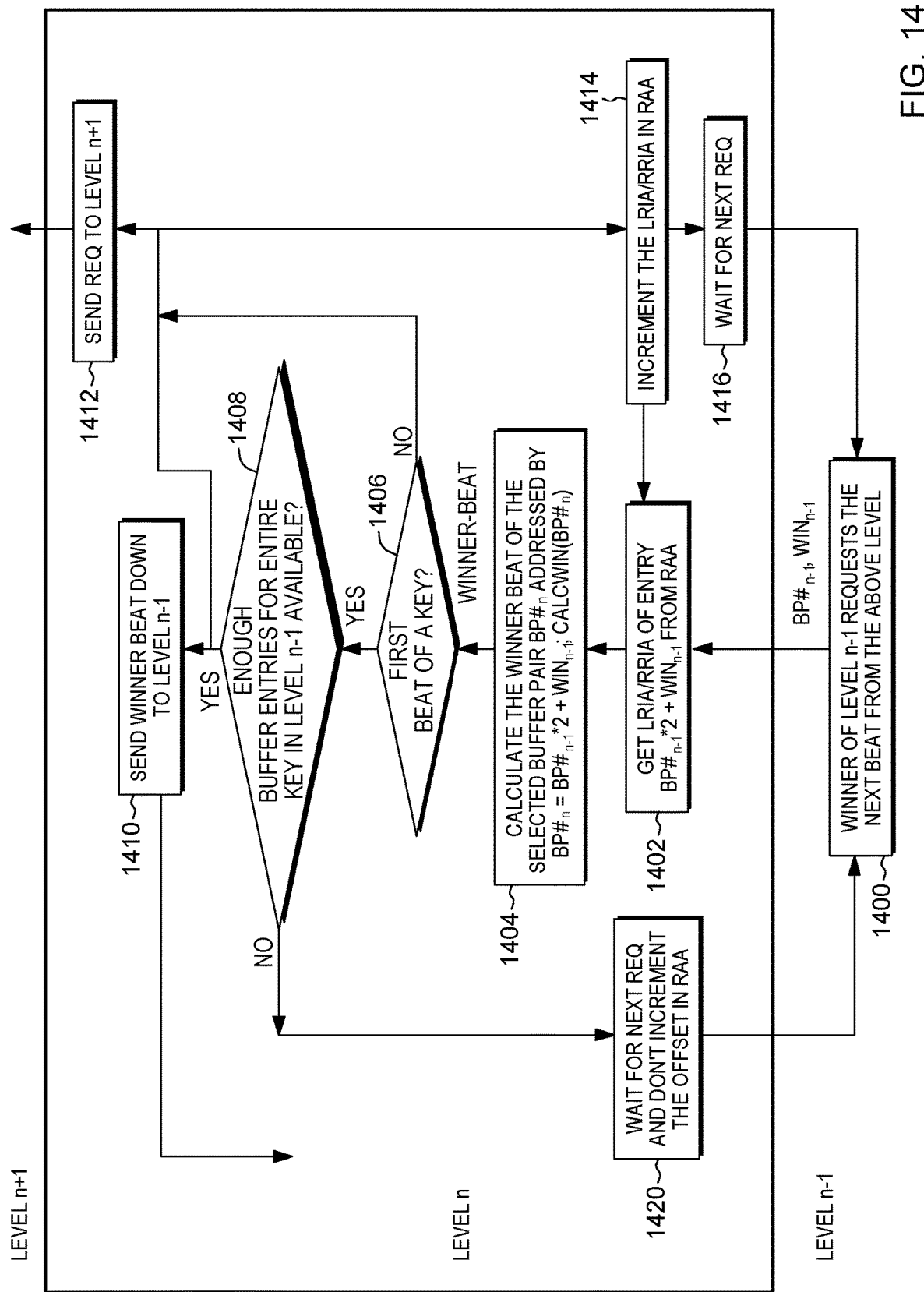
FIG. 14 depicts one example of processing using the read address array and the write address array of FIG. 13, in accordance with an aspect of the present invention.

One embodiment of logic using the read address array and the write address array to fill a winner buffer is described with reference to FIG. 14. In one example, this logic is part of the compare unit and is implemented in the FPGA.

At Level n−1 (e.g., Level 2 in the example of FIG. 13), a request is forwarded from the compare unit of Level n−1 to the compare unit of Level n (e.g., Level 3 in the example of FIG. 13) requesting a beat to fill the winner buffer of Level n−1 (1400). In one example, such a request includes BP $\#_{n-1}$, $WIN_{n-1}$.

At Level n, the request is received by the compare unit of that level and the entry of read address array 1300 corresponding to the winner buffer is read (1402). For instance, LRIA/RRIA of the entry corresponding to the winner buffer (e.g., BP $\#_{n-1}*2+WIN_{n-1}$) are obtained from RAA. The current beats of the selected buffer pair are compared to determine the winner beat (1404) (e.g., BP $\#_n$=BP $\#_{n-1}*2+WIN_{n-1}$; Calcwin(BP $\#_n$). A determination is made as to whether the winner beat is the first beat of a key (1406). If the winner beat is a first beat of a key, then a further determination is made as to whether there are enough free entries in the buffer in the lower level (e.g., Level 2 in this example) for an entire key (1408). If there are enough free entries in the lower level buffer for the entire key, then the winner beat is sent down to Level n−1 (e.g., Level 2 in this example) 1410. Further, or if it is not the first beat of a key, a request (REQ) is sent to Level n+1 to fill the buffer just emptied on Level n (1412).

Additionally, the offsets LRIA and RRIA in read address array 1300 are incremented 1414, and used to read the array based on receiving a request 1402. Processing waits for a next REQ 1416.

Returning to INQUIRY 1408, if there are not enough entries in the buffer of the lower level for an entire key, then processing continues to wait for a next request (REQ) and the offset in read address array 1300 is not incremented 1420.

As described above, in one aspect, the sizes of buffers used in a folded sort/merge structure may be reduced in one or more levels of the structure to a size less than a full record size. This provides efficiencies in the logic and requires less space.

Figure 15:
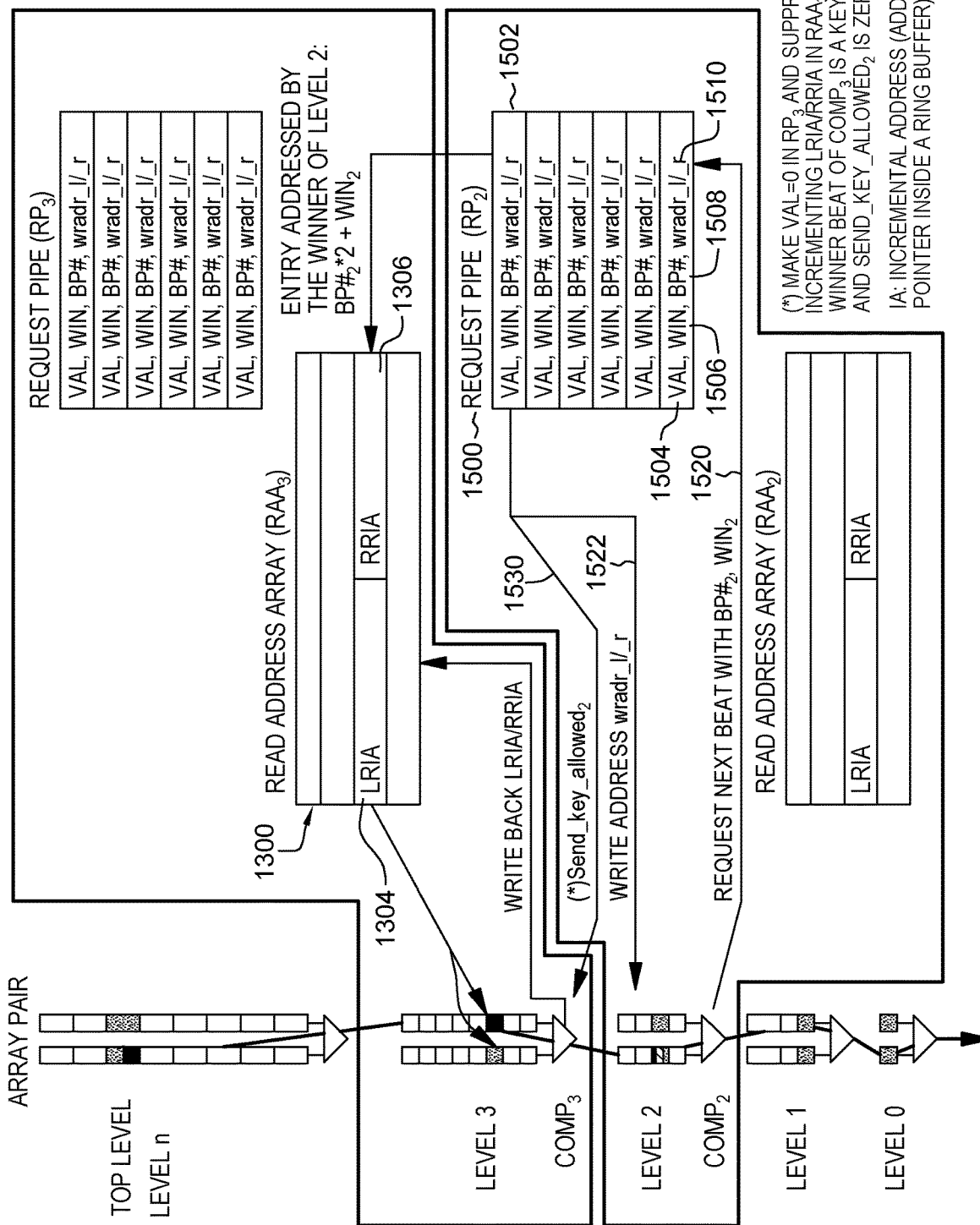
FIG. 15 depicts one example of a request pipe used in accordance with an aspect of the present invention.

In yet a further aspect, further efficiencies may be obtained by replacing the write address array with a hardware request pipe, which shifts every cycle. In one example, as depicted in FIG. 15, a request pipe (RP) 1500 is provided on each level and includes a plurality of entries 1502. Each entry 1502 includes, for instance, a valid indicator (Val) 1504; a Win indicator (WIN) 1506 used to indicate the winner buffer on the level corresponding to the request pipe; a buffer pair number (BP #) 1508 which indicates the compared buffer pair on this level; and a write address left/right 1510 of the buffer pair—both addresses are kept since the winner calculation between left and right may not be complete before the last key beat. The winner indication bits (WIN) of the key beats in the request pipe for this record are updated with the last key beat at once. By using such a request pipe continuous streaming is provided.

As further depicted in FIG. 15, a request 1520 for a next beat is input to request pipe 1500. The request includes, for instance, BP $\#_2$, $WIN_2$. When a winner is determined, the write address 1522 of the winner buffer (left or right) of the buffer pair is used to fill the buffer with a beat received from the next higher level compare result. The offsets of the record beats to be compared from the buffer pair on the next higher level are addressed by read address array 1300, an entry of which is selected based on the buffer winner.

In a further aspect, a send_key_allowed signal 1530 is used to indicate whether there is enough room in the buffer for a full key, which may be one or more beats in length. If there are not enough entries to receive a full key, send_key_allowed signal 1530 stalls the retrieval of the beat. A hold state occurs if the winner is a key beat and send_allowed_key signal is equal to zero. Thus, the valid indicator, val, 1504 is set to 0 in the request pipe on the level to provide the beat and an increment of the address in this level in the RAA is suppressed.

Figure 16:
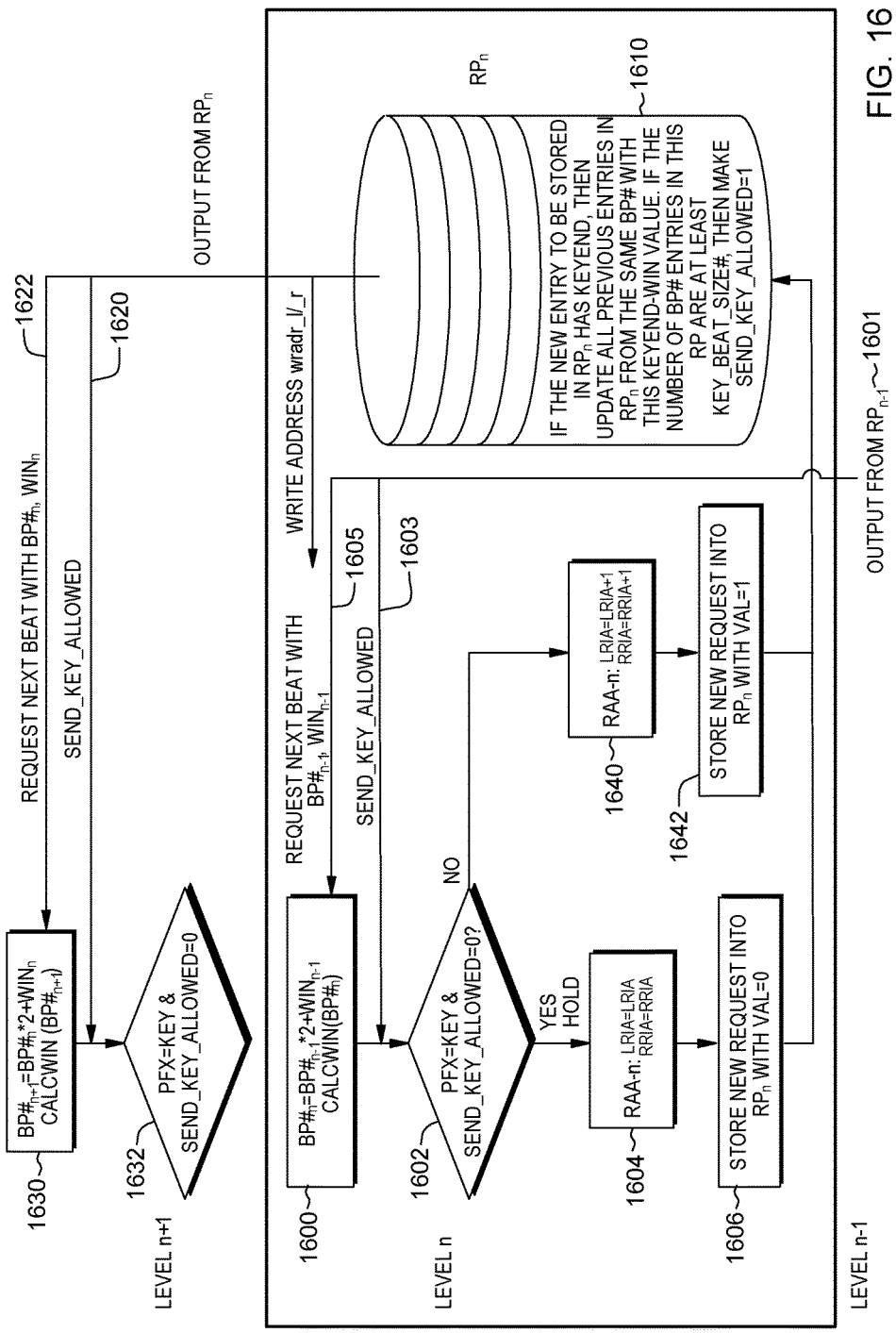
FIG. 16 depicts one example of processing using the request pipe of FIG. 15, in accordance with an aspect of the present invention.

One embodiment of using the request pipe is described with reference to FIG. 16. At Level n−1, the output from and/or associated with request pipe on Level n−1 is input to Level n 1601. This includes, for instance, send_key_allowed signal 1603 and a request of the next beat (BP $\#_{n-1}$, $WIN_{n-1}$) 1605. At Level n, the beats of the buffer pair selected based on the winner buffer of Level n−1 are compared to determine a winner beat (1600). For example, BP $\#_n$=BP $\#_{n-1}*2+WIN_{n-1}$+Calcwin (BP $\#_n$) A determination is made as to whether the prefix of the winner indicates a key and whether send_key_allowed signal 1603 indicates stall (send_key_allowed signal=0). If the winner beat is a key beat and a stall is indicated 1602, then the read address array for level n is not incremented 1604. The new request is stored into the request pipe with val=0 (1606).

At 1610, if the new entry to be stored in request pipe n has a key end beat indication (KEBT=1), then the previous entries in this request pipe with the same buffer pair number (BP #) are updated with this winner (e.g., WIN is set equal to 0 or 1 for all entries with same BP #). The send_key_allowed indication is calculated for the top entry of the request pipe which builds the output of this request pipe. Send_key_allowed is set to one, e.g., if the number of all request pipe entries with this BP # are equal or greater than key beats (indicating no stall; the key beat may be passed down to fill the buffer). The send_key_allowed signal 1620 from the request pipe is sent to Level n+1. Further, a request 1622 for a next beat for the appropriate buffer is also sent to Level n+1.

Returning to 1602, if the winner beat is not a key beat or if send_key_allowed does not equal a stall, then the read addresses in the read address array of Level n are incremented (1640). For instance, LRIA and RRIA are incremented by one. A new request is stored into the request pipe with val=1 (1642).

At Level n+1, beats of the selected buffer pair are compared to provide a winner (1630). Further, a determination is made as to whether the prefix of the winner indicates a key and whether send_key_allowed signal 1620 indicates a stall (send_key_allowed signal=0) (1632). Processing continues as described herein.

As described above, at least one request pipe is used to hold requests from one level to the next level, in which a request includes a winner indication (left or right), a write address for the left buffer, a write address for the right buffer, and a buffer indication to specify which buffers from the next stage level are to be compared for the requested result. The respective winner indications of the key beats for a record in the request pipe are updated with the last key beat, for instance, at once.

Many variations are possible without departing from a spirit of aspects of the present invention. It should be noted that various aspects and features are described herein, and unless otherwise inconsistent, each aspect or feature may be combinable with any other aspect or feature.

One or more aspects of the present invention are inextricably tied to computer technology and facilitate processing within a computer, improving performance thereof.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), circuits, and/or computer program products according to embodiments of the invention. It will be understood that each block of the flowchart illustrations and/or block diagrams, and combinations of blocks in the flowchart illustrations and/or block diagrams, may be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although various embodiments are described above, these are only examples. Other implementations of one or more aspects are possible. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A compare unit comprising:
   a comparator, said comparator comprising:
      a first input to receive one beat of one record to be sorted, the one beat comprising at least a portion of a key, at least a portion of data, at least a blank portion or any combination of key, data or blank portions and comprising one set of control indicators, the one set of control indicators comprising one control indicator that is a key indicator indicating a type of the one beat is a key beat, a data indicator indicating the type of the one beat is a data beat or an end indicator indicating a selected ending condition;
      a second input to receive a different beat of a different record to be sorted, the different beat comprising at least a portion of a different key, at least a portion of different data, at least a different blank portion or any combination of different key, different data or different blank portions and comprising another set of control indicators, the another set of control indicators comprising a selected control indicator that indicates the type of the different beat or a particular ending condition; and
      logic coupled to the first input and the second input to compare the one beat and the different beat to provide a result, the logic to use at least the one control indicator of the one set of control indicators and the selected control indicator of the another set of control indicators to determine the result.

2. The compare unit of claim 1, wherein the end indicator is an end of list indicator or an end of buffer indicator.

3. The compare unit of claim 1, wherein the one set of control indicators further comprises a run indicator to indicate which run the one record belongs.

4. The compare unit of claim 1, wherein the particular ending condition is an end of list indicator or an end of buffer indicator.

5. The compare unit of claim 1, wherein the another set of control indicators further comprises a run indicator to indicate which run the different record belongs.

6. The compare unit of claim 1, wherein the one set of control indicators comprises the data indicator specifying that the type of the one beat is the data beat, and wherein the another set of control indicators indicates that the type of the different beat is the key beat, and wherein the logic determines the data beat is the result.

7. The compare unit of claim 1, wherein the one set of control indicators or the another set of control indicators comprises a key end beat indicator specifying the one beat or the different beat is an end of a key beat, and wherein the compare unit further comprises additional logic to determine the result using the key end beat indicator.

8. The compare unit of claim 1, wherein the logic further receives a previous winner input to indicate a previous winner buffer, the logic to use the indication of the previous winner buffer, the one set of control indicators, and the another set of control indicators to determine the result.

9. The compare unit of claim 1, further comprising request logic to request one or more additional beats from a different compare unit coupled to the compare unit.

10. The compare unit of claim 9, wherein the different compare unit is on a different hierarchical level than the compare unit.

11. The compare unit of claim 1, wherein the one beat or the different beat is the key beat, the key beat being of a variable length key divided into one or more beats.

12. The compare unit of claim 1, wherein the one record or the different record is a variable length record.

13. An integrated circuit comprising:
    a field programmable gate array, the field programmable gate array comprising:
       a comparator, said comparator comprising:
          a first input to receive one beat of one record to be sorted, the one beat comprising at least a portion of a key, at least a portion of data, at least a blank portion or any combination of key, data or blank portions and comprising one set of control indicators, the one set of control indicators comprising one control indicator that is a key indicator indicating a type of the one beat is a key beat, a data indicator indicating the type of the one beat is a data beat or an end indicator indicating a selected ending condition;

a second input to receive a different beat of a different record to be sorted, the different beat comprising at least a portion of a different key, at least a portion of different data, at least a different blank portion or any combination of different key, different data or different blank portions and comprising another set of control indicators, the another set of control indicators comprising a selected control indicator that indicates the type of the different beat or a particular ending condition; and logic coupled to the first input and the second input to compare the one beat and the different beat to provide a result, the logic to use at least the one control indicator of the one set of control indicators and the selected control indicator of the another set of control indicators to determine the result.

14. The integrated circuit of claim 13, wherein the end indicator is an end of list indicator or an end of buffer indicator.

15. The integrated circuit of claim 13, wherein the one set of control indicators comprises the data indicator specifying that the type of the one beat is the data beat, and wherein the another set of control indicators indicates that the type of the different beat is the key beat, and wherein the logic determines the data beat is the result.

16. The integrated circuit of claim 13, wherein the one beat or the different beat is the key beat, the key beat being of a variable length key divided into one or more beats.

17. A method of sorting records, said method comprising:
receiving, by a comparator, one beat of one record to be sorted, the one beat comprising at least a portion of a key, at least a portion of data, at least a blank portion or any combination of key, data or blank portions and comprising one set of control indicators, the one set of control indicators comprising one control indicator that is a key indicator indicating a type of the one beat is a key beat a data indicator indicating the type of the one beat is a data beat or an end indicator indicating a selected ending condition;

receiving, by the comparator, a different beat of a different record to be sorted, the different beat comprising at least a portion of a different key, at least a portion of different data, at least a different blank portion or any combination of different key, different data or different blank portions and comprising another set of control indicators, the another set of control indicators comprising a selected control indicator that indicates the type of the different beat or a particular ending condition; and comparing, by the comparator, the one beat and the different beat to determine a result, the comparing using at least the one control indicator of the one set of control indicators and the selected control indicator of the another set of control indicators to determine the result.

18. The method of claim 17, wherein the end indicator is an end of list indicator or an end of buffer indicator.

19. The method of claim 17, wherein the ene r e one set of control indicators comprises the data indicator specifying that the type of the one beat is the data beat, and wherein the another set of control indicators indicates that the different beat is the key beat, and wherein the comparing determines the data beat is the result.

20. The method of claim 17, wherein the one beat or the different beat is the key beat, the key beat being of a variable length key divided into one or more beats.

* * * * *